United States Patent
Furuhashi

(10) Patent No.: US 8,753,973 B2
(45) Date of Patent: Jun. 17, 2014

(54) METHOD OF FABRICATING SEMICONDUCTOR MEMORY DEVICE

(75) Inventor: Hironobu Furuhashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,948

(22) Filed: Sep. 5, 2012

(65) Prior Publication Data

US 2013/0237028 A1    Sep. 12, 2013

(30) Foreign Application Priority Data

Sep. 13, 2011    (JP) ................................ 2011-199949

(51) Int. Cl.
*H01L 21/8242*    (2006.01)
*H01L 23/528*    (2006.01)
*H01L 23/538*    (2006.01)

(52) U.S. Cl.
USPC .......................................... 438/622; 438/393

(58) Field of Classification Search
None
See application file for complete search history.

(56) References Cited

U.S. PATENT DOCUMENTS

2011/0070713 A1    3/2011    Nansei
2013/0010520 A1*   1/2013    Murooka ...................... 365/148

FOREIGN PATENT DOCUMENTS

JP    2011-71226    4/2011

* cited by examiner

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

According to one embodiment, a method of fabricating a semiconductor memory device includes patterning a first memory cell layer and a first interconnect layer to form a first structure of a linear pattern in a first region and a second structure in a second region, forming a second interconnect layer and a second memory cell layer, and patterning the second memory cell layer and the second interconnect layer to form, in the first region, a third structure having a linear pattern and having a folded pattern immediately on the second structure. The method further includes removing the second memory cell layer and the second interconnect layer in the folded pattern, and the first memory cell layer of the second structure positioned under the folded pattern.

17 Claims, 34 Drawing Sheets

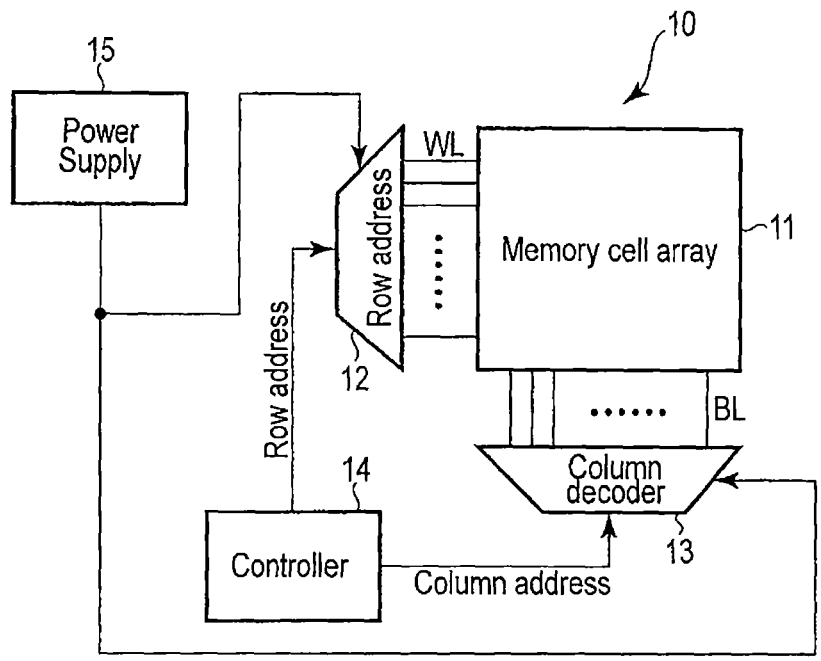
F I G. 1
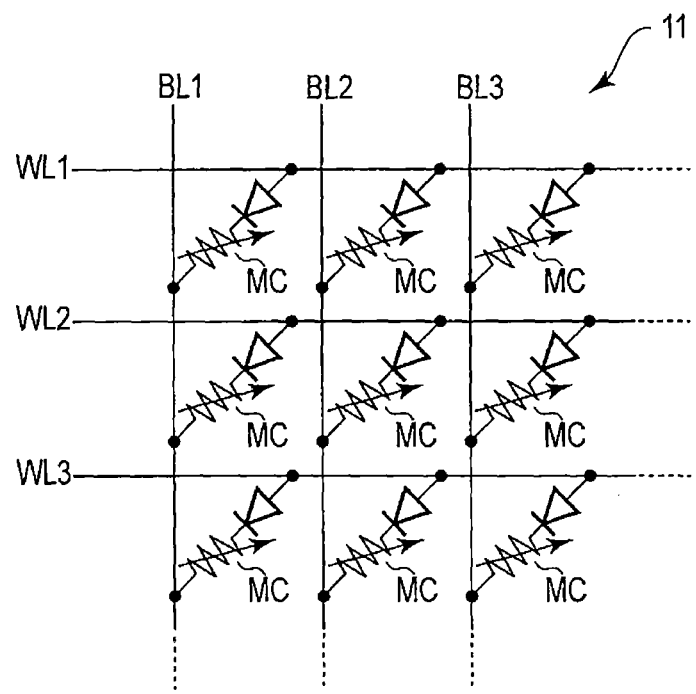
F I G. 2

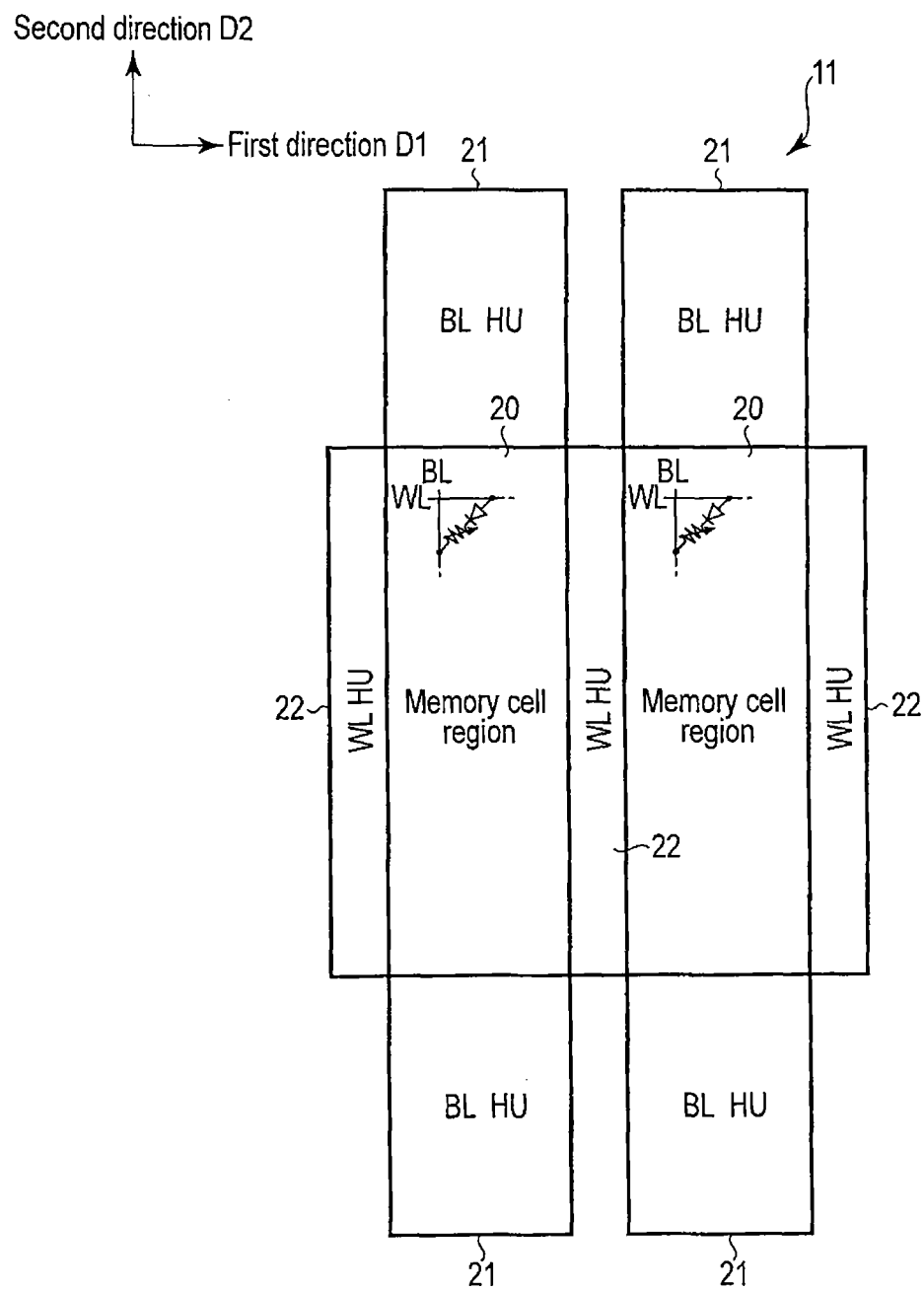
F I G. 3

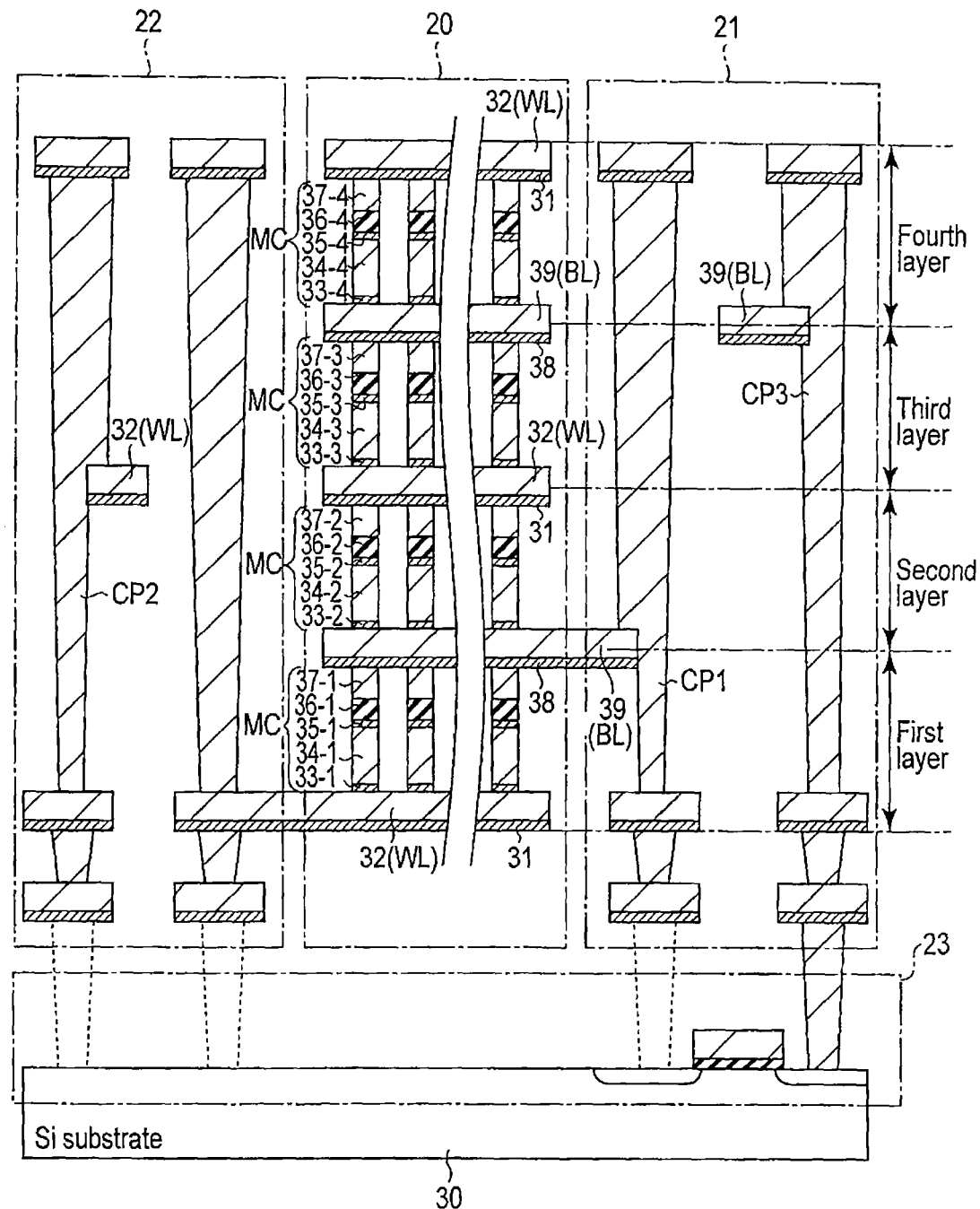
F I G. 4

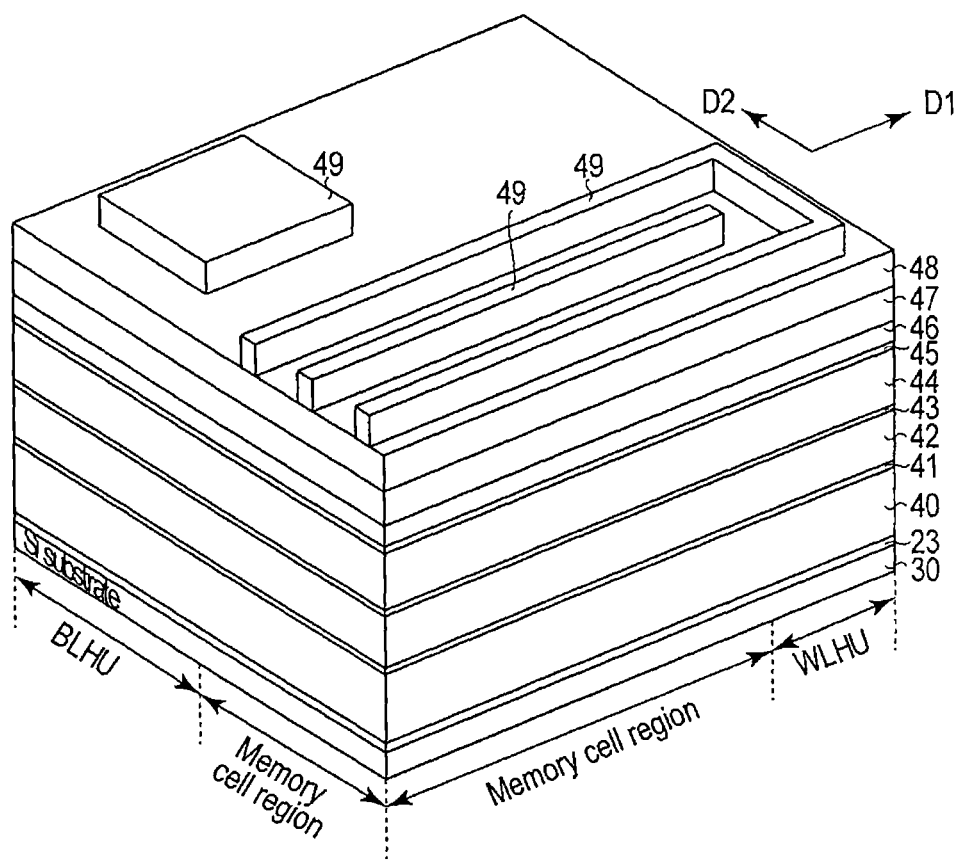
F I G. 5

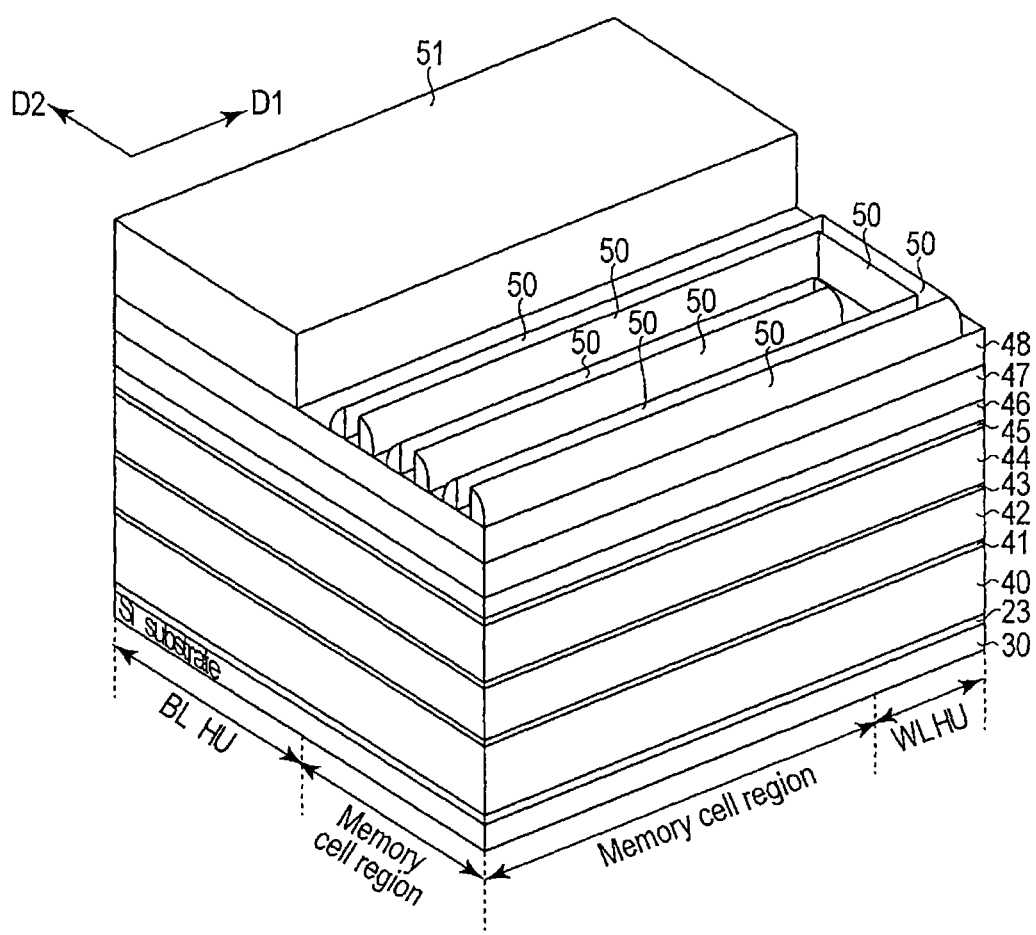
F I G. 9

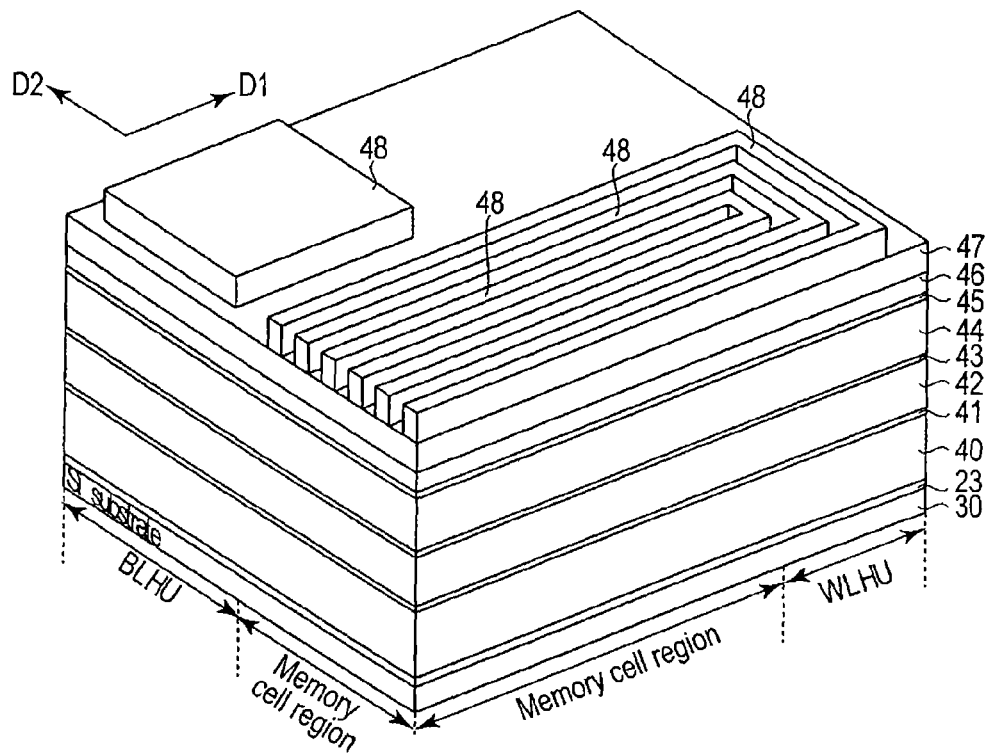
F I G. 10
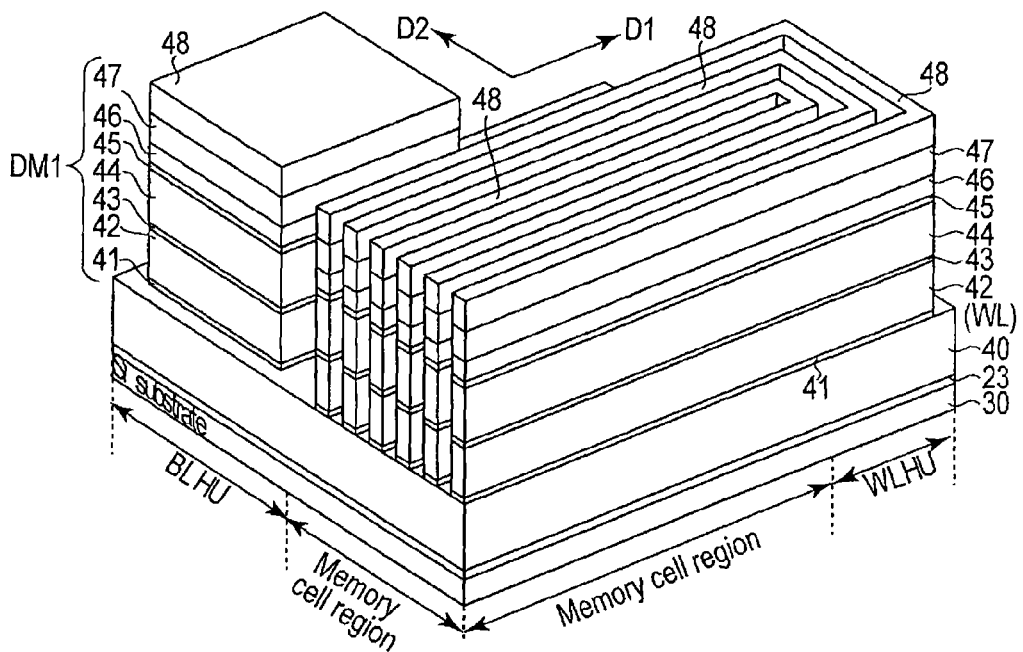
F I G. 11

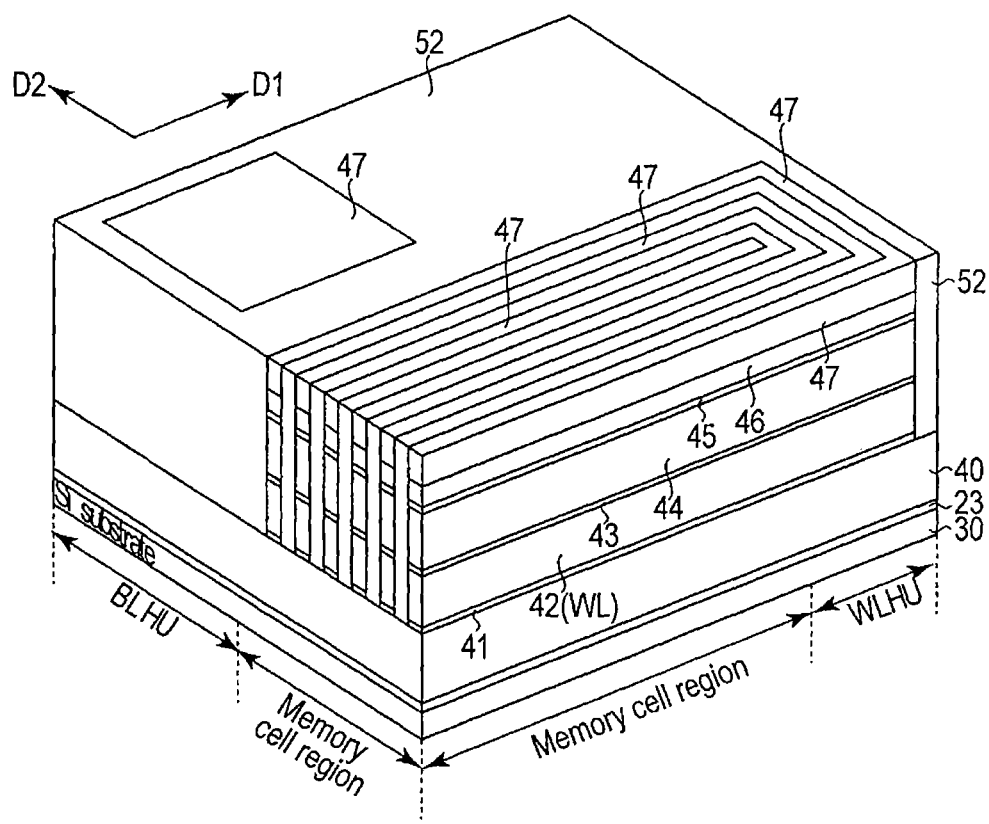
F I G. 12

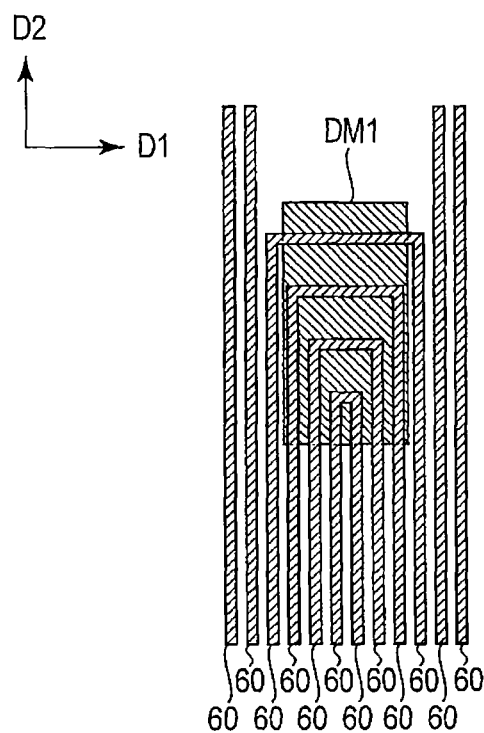
F I G. 16
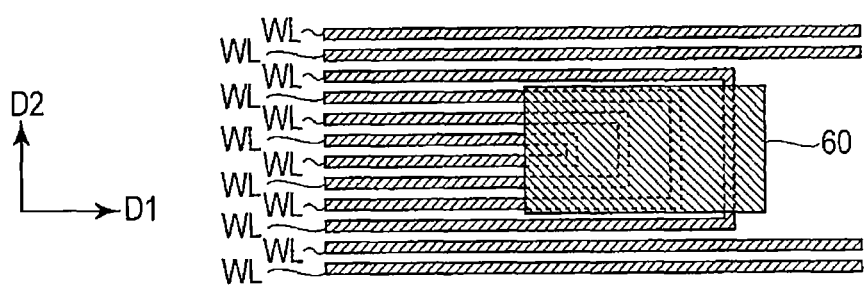
F I G. 17

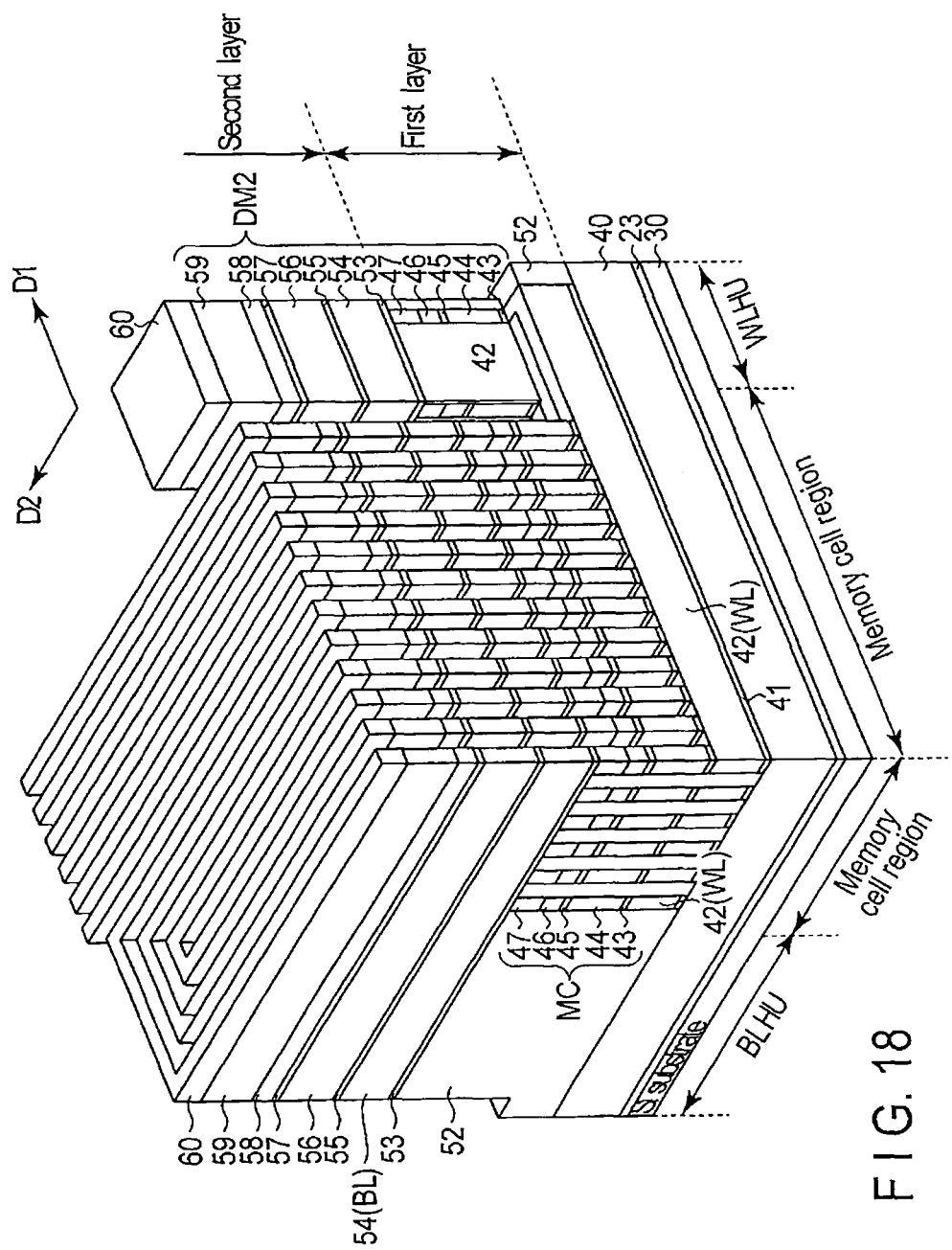
F I G. 18

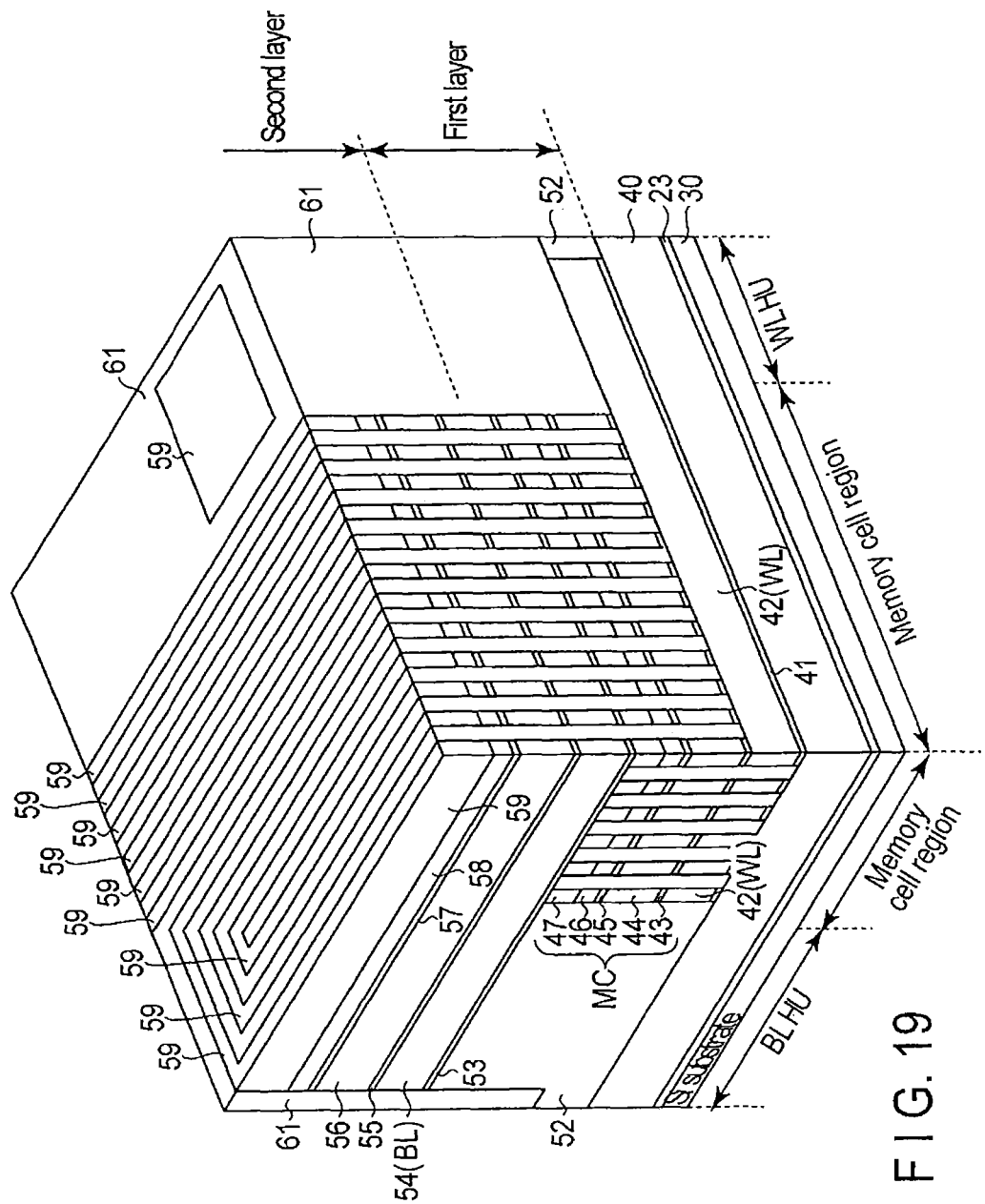
F I G. 19

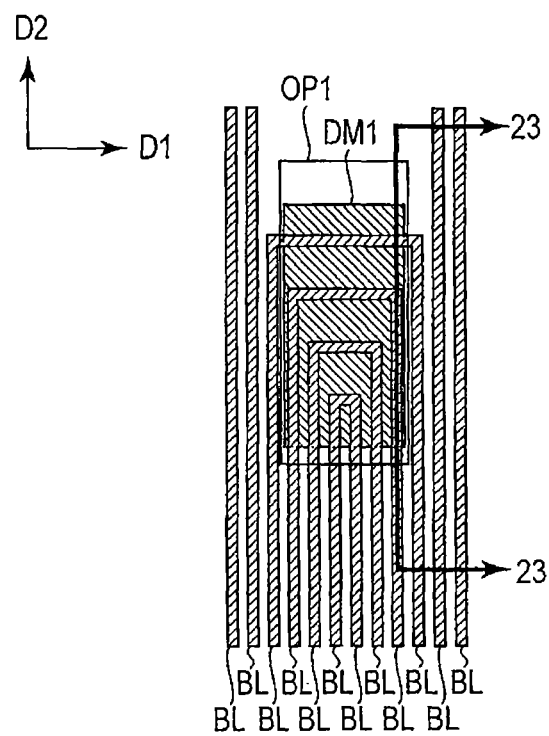
F I G. 21
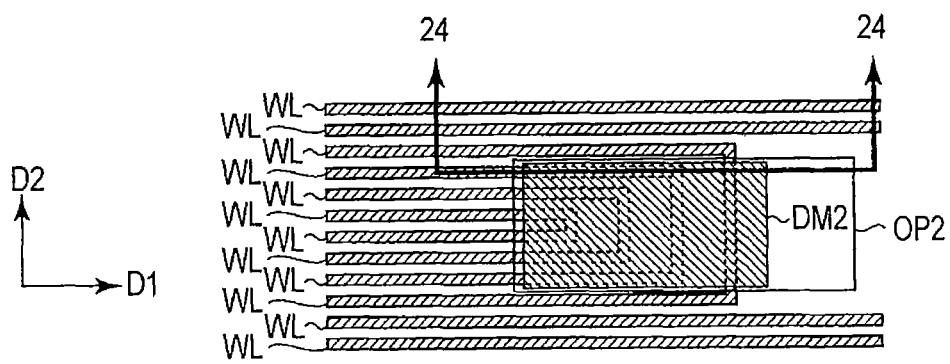
F I G. 22

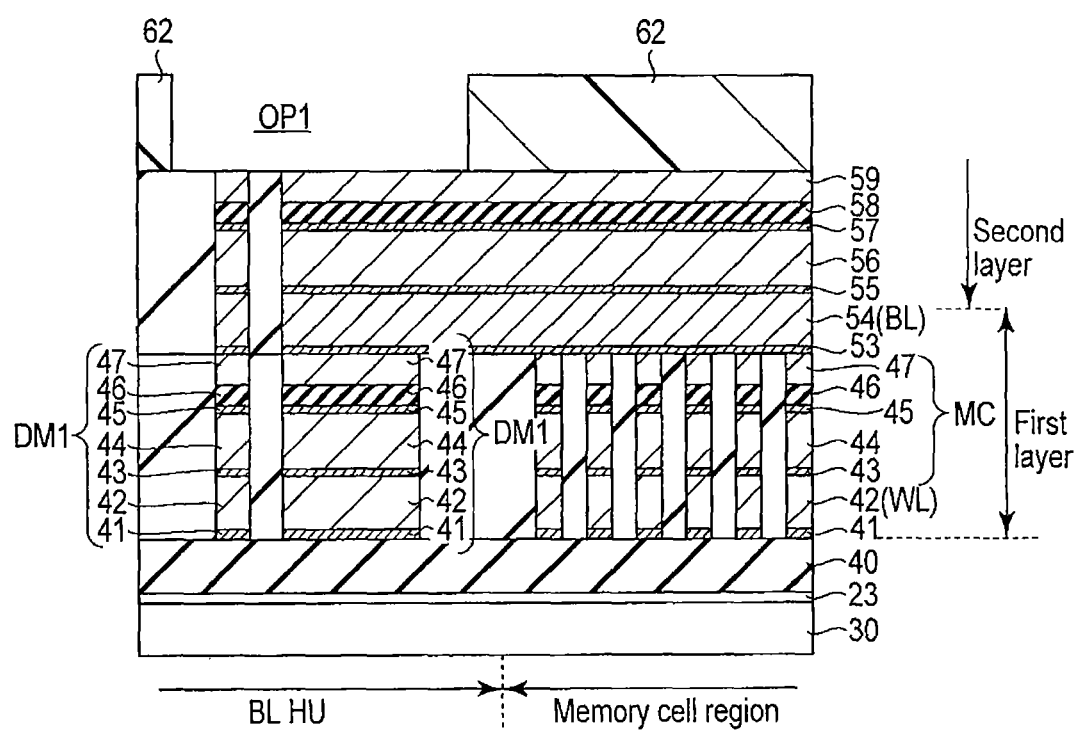
F I G. 23

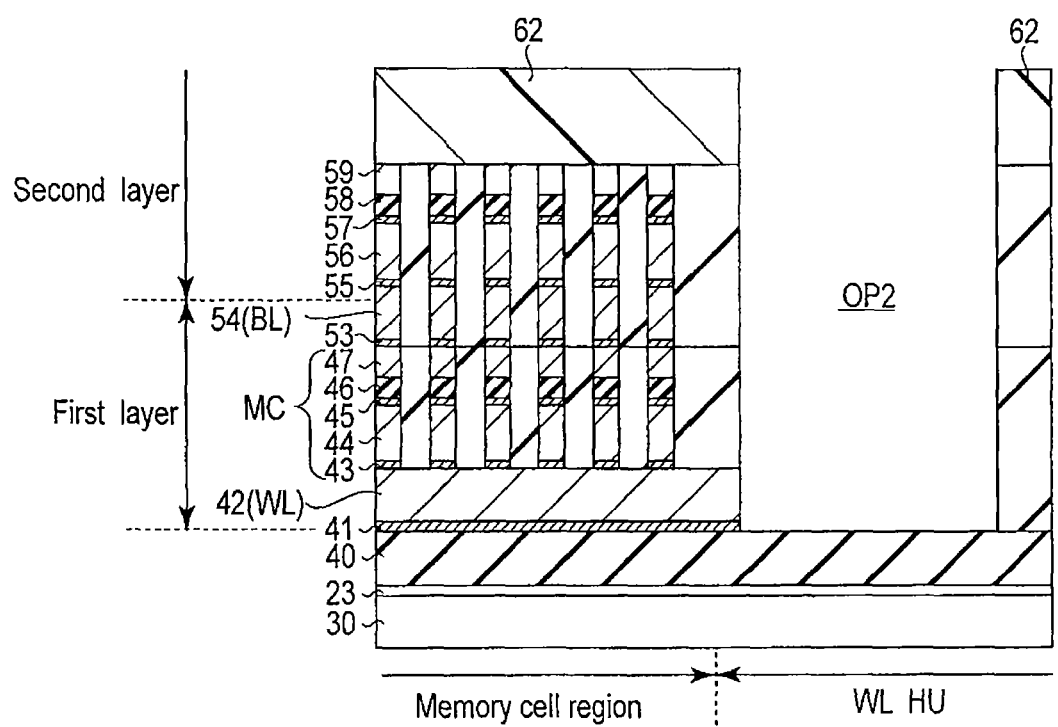
F I G. 29

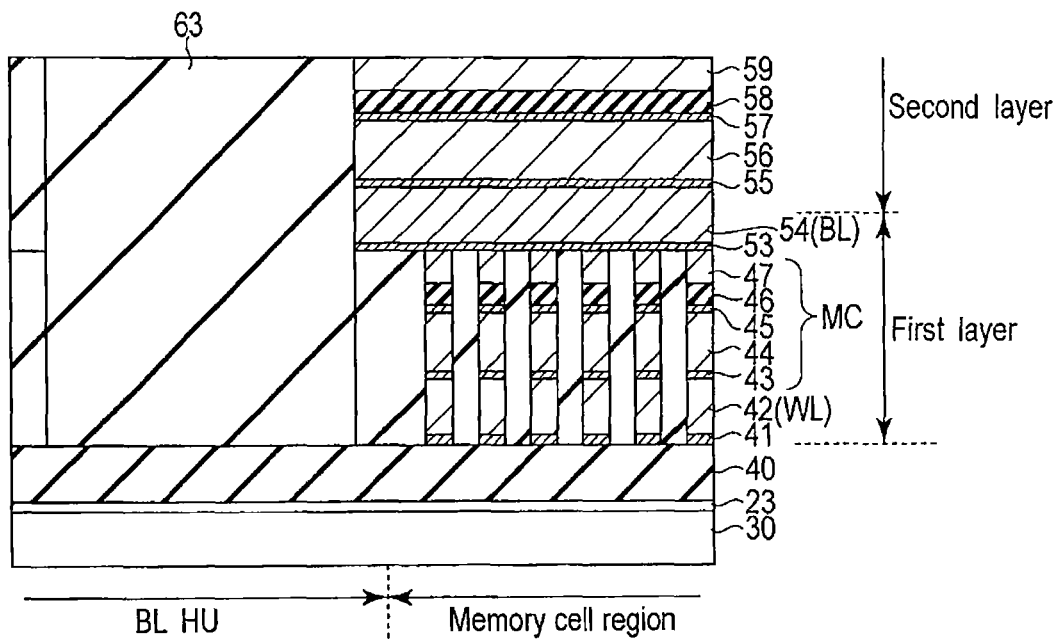
F I G. 31
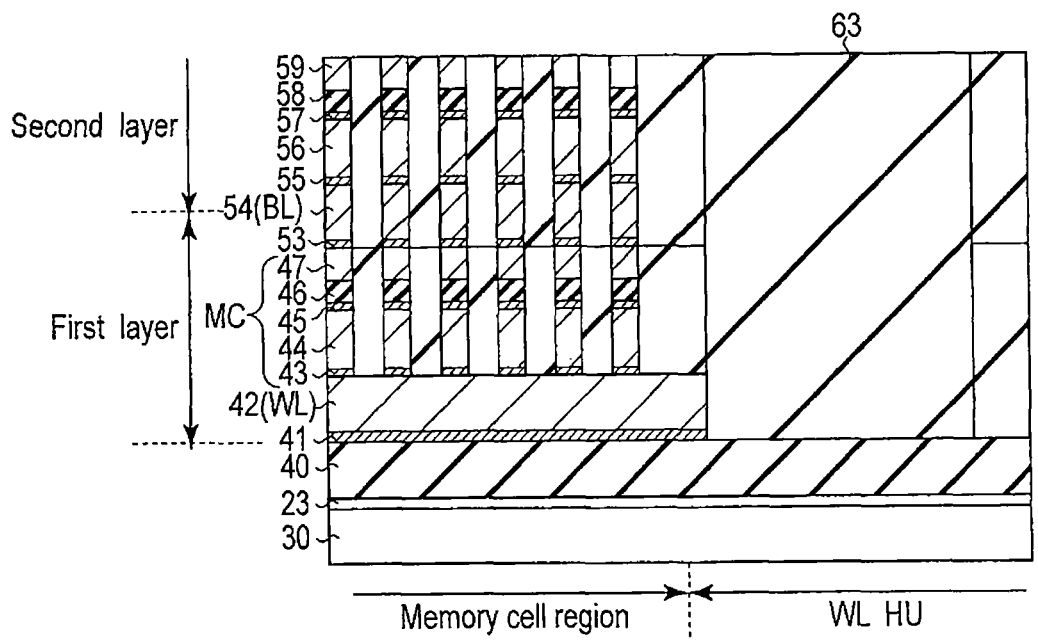
F I G. 32

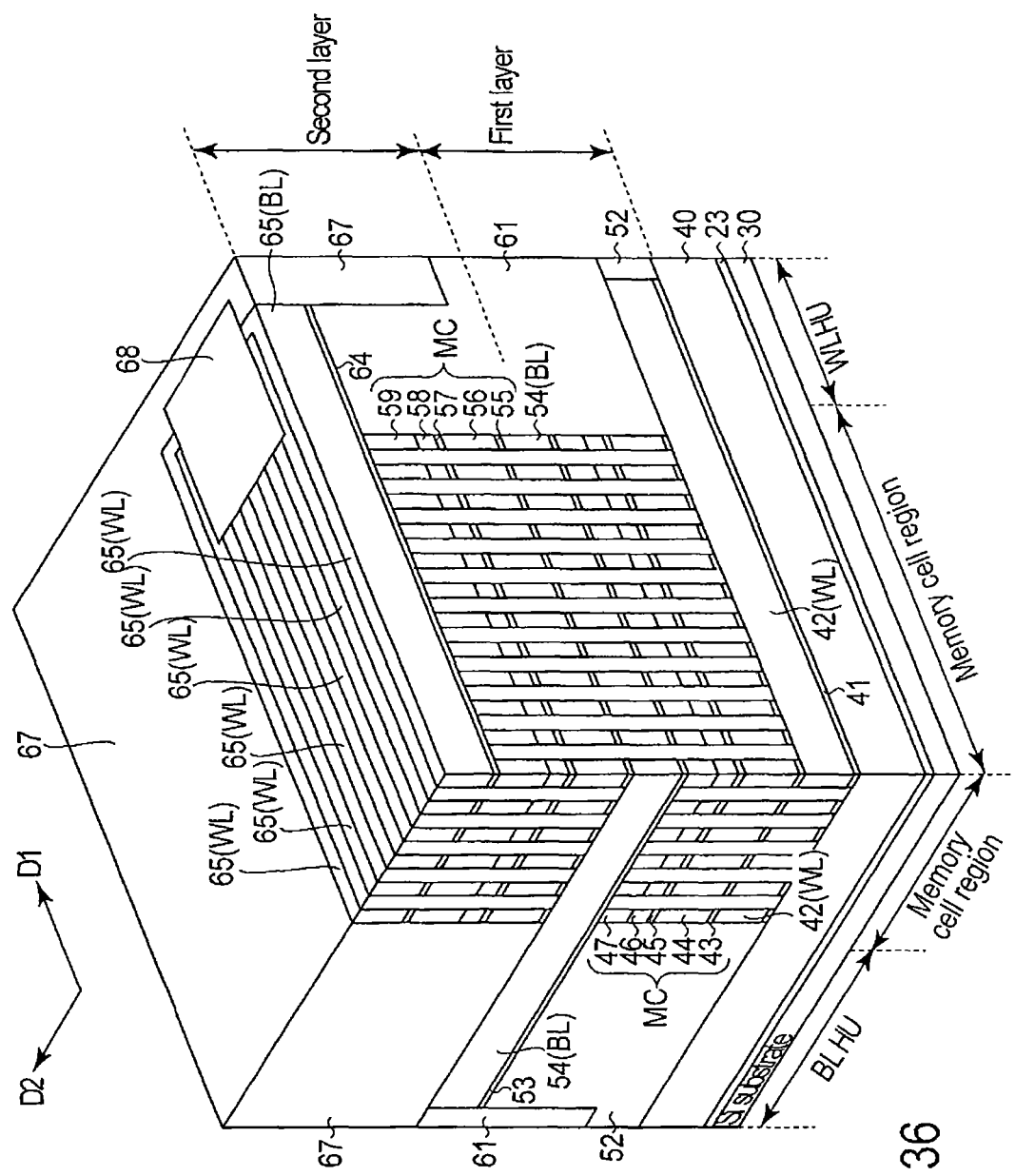
F I G. 36

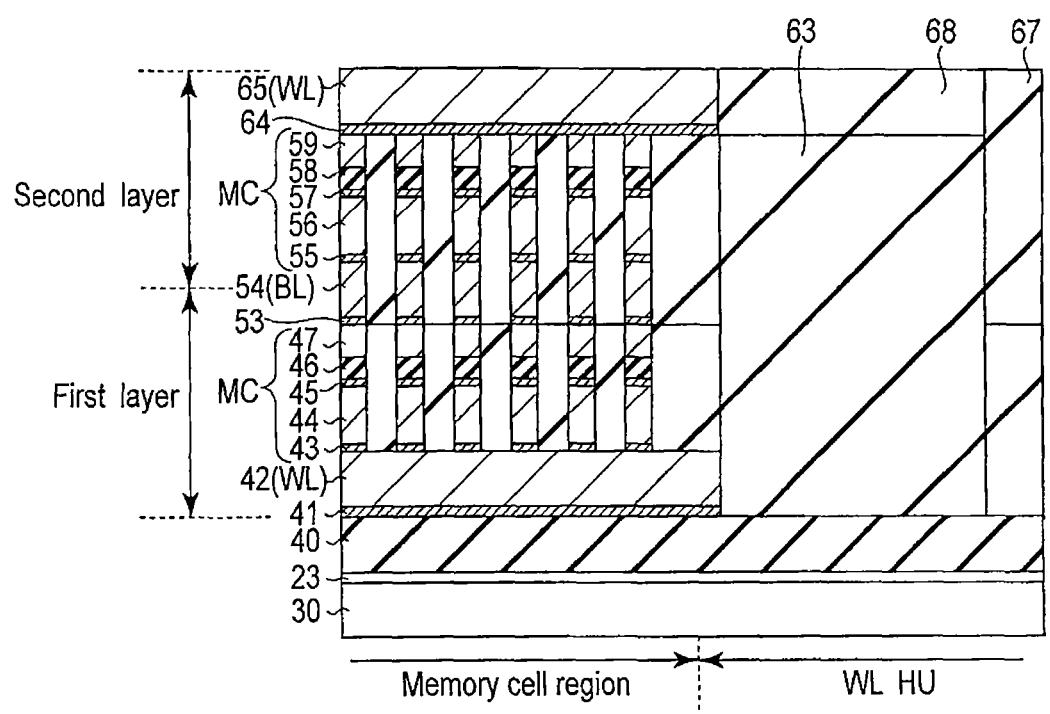
F I G. 37

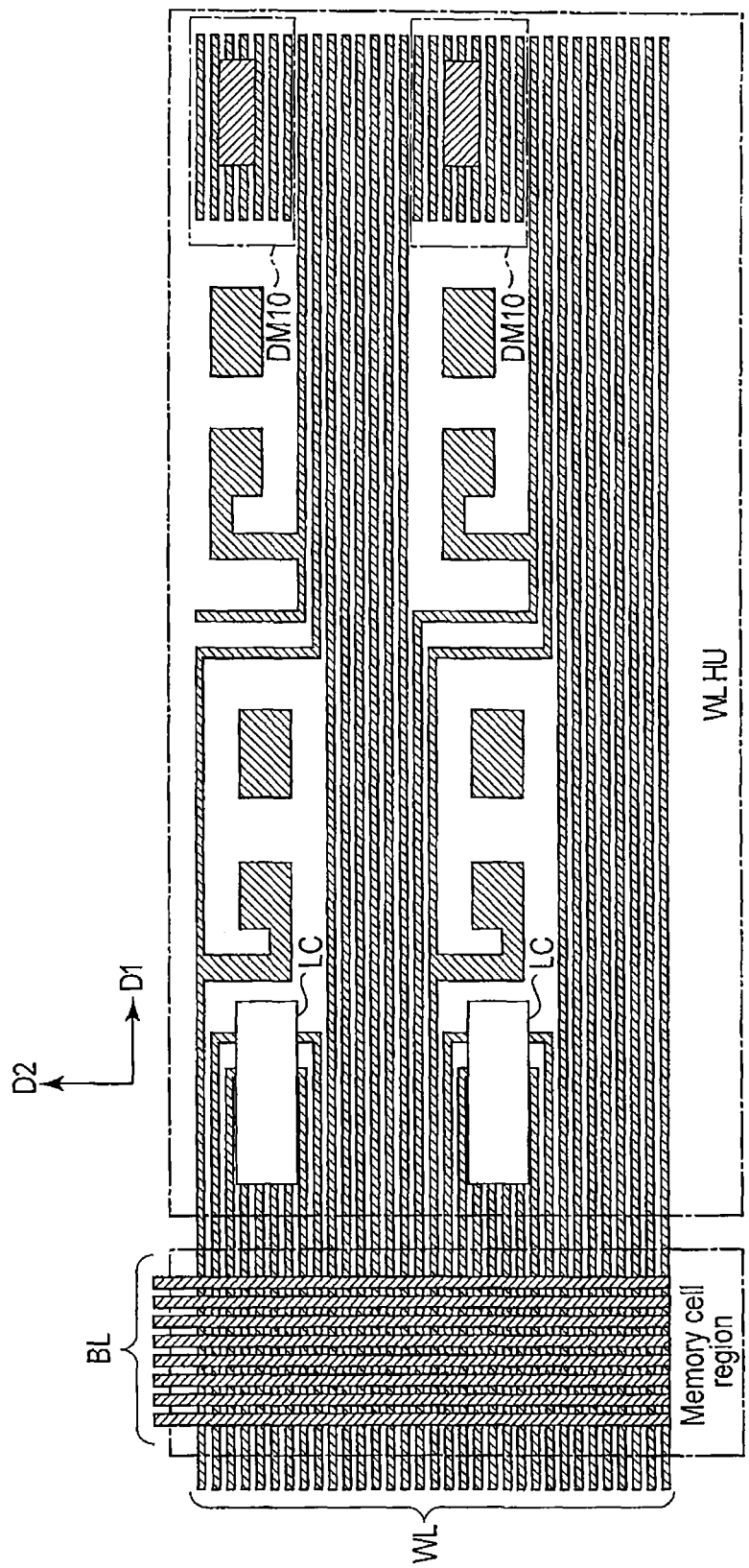
F I G. 38

US 8,753,973 B2

METHOD OF FABRICATING SEMICONDUCTOR MEMORY DEVICE

CROSS-REFERENCE TO RELATED APPLICATIONS

This application is based upon and claims the benefit of priority from Japanese Patent Application No. 2011-199949, filed Sep. 13, 2011, the entire contents of which are incorporated herein by reference.

FIELD

Embodiments described herein relate generally to a method of fabricating a semiconductor memory device.

BACKGROUND

In recent years, a double patterning technology has been used in fabricating a three-dimensional cross point type memory device. To fabricate such a miniaturized memory device, a very large number of steps are required.

BRIEF DESCRIPTION OF THE DRAWINGS

FIG. 1 is a block diagram of a semiconductor memory device according to one embodiment;

FIG. 2 and FIG. 3 are a circuit diagram and a plan view of a memory cell array according to the one embodiment, respectively;

FIG. 4 is a sectional view of the semiconductor memory device according to the one embodiment;

FIG. 5, FIG. 7, FIG. 8, FIG. 9, FIG. 10, FIG. 11, FIG. 12, FIG. 13, FIG. 14, FIG. 18, FIG. 19, FIG. 20, FIG. 25, FIG. 30, FIG. 33, FIG. 34 and FIG. 36 are perspective views sequentially showing fabricating steps of the semiconductor memory device according to the one embodiment;

FIG. 6, FIG. 15, FIG. 16, FIG. 17, FIG. 21, FIG. 22, FIG. 26 and FIG. 27 are plan views sequentially showing fabricating steps of the semiconductor memory device according to the one embodiment;

FIG. 23, FIG. 24, FIG. 28, FIG. 29, FIG. 31, FIG. 32, FIG. 35 and FIG. 37 are sectional views sequentially showing fabricating steps of the semiconductor memory device according to the one embodiment;

FIG. 38 is a plan view of a word line hookup region;

DETAILED DESCRIPTION

Figure 6:
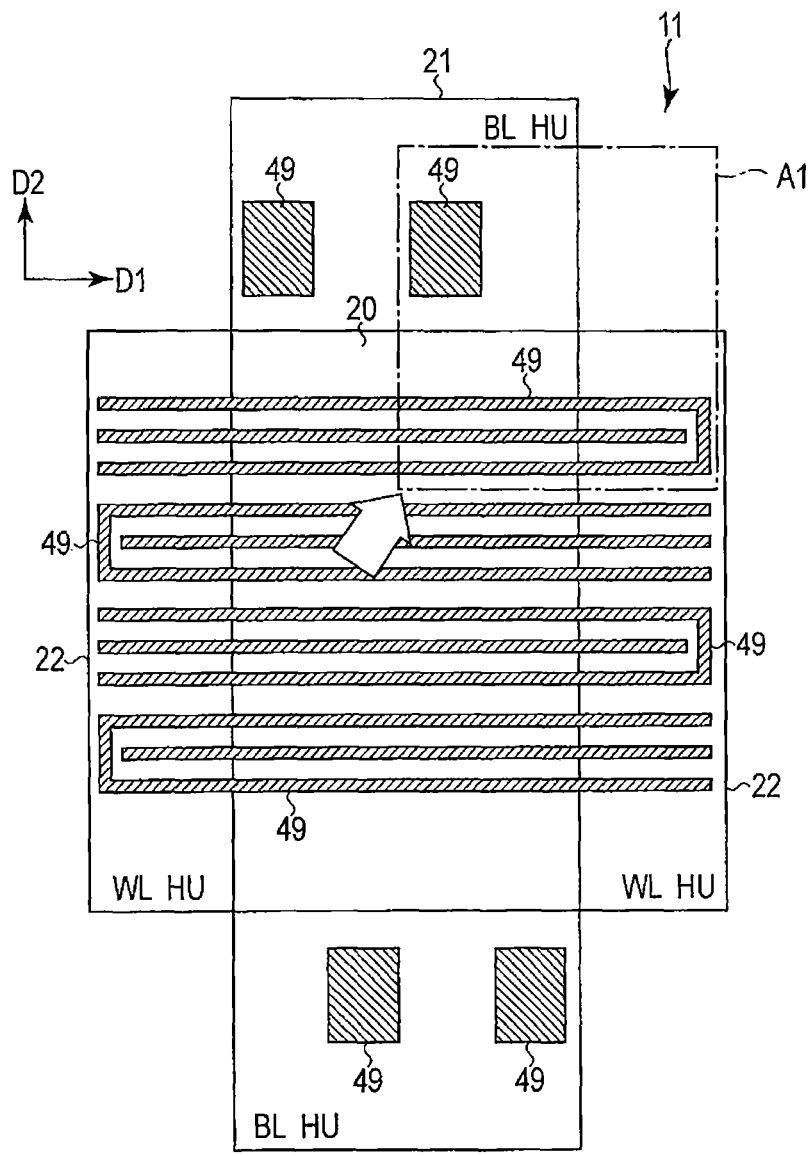

In general, according to one embodiment, a method of fabricating a semiconductor memory device includes:

forming a first interconnect layer and a first memory cell layer sequentially;

patterning the first memory cell layer and the first interconnect layer to form a first structure of a linear pattern along a first direction in a first region and a second structure in a second region;

forming a second interconnect layer and a second memory cell layer sequentially on the first structure and the second structure;

patterning the second memory cell layer and the second interconnect layer to form, in the first region, a third structure having a linear pattern along a second direction different from the first direction and having a folded pattern at a region immediately on the second structure in the second region; and removing the first memory cell layer and the second interconnect layer in the folded pattern of the third structure, and the first memory cell layer of the second structure positioned immediately under the folded pattern.

The method of fabricating the semiconductor memory device according to the one embodiment will be described. Hereinafter, as an example of the semiconductor memory device, a resistive RAM (the ReRAM) which is a three-dimensional cross point type memory will be described.

1. Regarding Structure of Semiconductor Memory Device

First, a structure of the semiconductor memory device according to the present embodiment will be described.

1.1 Regarding Overall Structure of Semiconductor Memory Device

FIG. 1 is a block diagram of the semiconductor memory device according to the present embodiment. As shown in FIG. 1, a semiconductor memory device 10 includes a memory cell array 11, a row decoder 12, a column decoder 13, a controller 14 and a power supply 15.

Memory cell array 11 includes memory cells MC which can hold data. FIG. 2 is a circuit diagram of memory cell array 11. As shown in FIG. 2, in memory cell array 11, memory cells MC each including a diode and a variable resistance element are arranged in the form of a matrix. In the present example, each cathode of the diode is connected to one end of the variable resistance element, anodes of the diodes of memory cells MC present in the same row are connected to the same word line WL, and the other ends of the variable resistance elements of memory cells MC present in the same column are connected to the same bit line BL. In FIG. 2, due to limitation of a paper space, memory cell array 11 is two-dimensionally shown, but in memory cell array 11, the structures shown in FIG. 2 are stacked in a direction vertical to a paper surface.

Returning to FIG. 1, the description will be continued. Row decoder 12 includes a word line selecting module and a word line driver. Moreover, the word line selecting module selects word line WL on the basis of a row address received from controller 14. Then, the word line driver applies, to the selected word line and unselected word lines, voltages required to read, write and erase the data.

Column decoder 13 includes a bit line selecting module and a bit line driver. Moreover, the bit line selecting module selects bit line BL on the basis of a column address received from controller 14. Then, the bit line driver applies, to the selected bit line and unselected bit lines, voltages required to read, write and erase the data.

Controller 14 controls the whole operation of semiconductor memory device 10. Moreover, controller supplies the required addresses described above to row decoder 12 and column decoder 13. Moreover, at the writing of the data, controller 14 instructs row decoder 12 and column decoder 13 to apply the required voltages so as to change a resistance state of the variable resistance element of the selected memory cell MC. Furthermore, at the reading of the data, controller instructs row decoder 12 and column decoder 13 to apply the required voltages so as to detect a resistance value of the variable resistance element of the selected memory cell MC as a storage state of memory cell MC.

Power supply 15 generates a predetermined voltages required to read, write and erase the data. More specifically, power supply 15 generates a bias voltage VSW of the selected word line and a bias voltage VUW of each of the unselected word lines, to supply the voltages to row decoder 12. Furthermore, power supply 15 generates a bias voltage VSB of the selected bit line and a bias voltage VUB of each of the unselected bit lines, to supply the voltages to column decoder 13. In consequence, for example, at the writing of the data, a large potential difference is made between the selected word line and the selected bit line, to change the resistance state of the variable resistance element. Moreover, at the reading of the data, in a range in which the resistance state is not changed, a potential difference is made between the selected word line and the selected bit line, and a current flowing through the bit line or the word line is detected.

1.2 Regarding Detail of Memory Cell Array 11

Next, the structure of memory cell array 11 will be described in detail. FIG. 3 is a plan view of the memory cell array 11.

As shown in FIG. 3, memory cell array 11 roughly includes memory cell regions 20, bit line hookup regions (the BL HU regions) 21, and word line hookup regions (the WL HU regions) 22.

Memory cell regions 20 are included in memory cell array 11, and each of the regions includes memory cells MC described with reference to FIG. 2.

BL HU regions 21 are adjacent to memory cell regions 20 in a second direction D2. Moreover, bit lines BL of memory cell regions 20 are drawn to BL HU regions 21. In BL HU regions 21, the drawn bit lines BL are connected to a peripheral circuit (column decoder 13).

WL HU regions 22 are adjacent to memory cell regions 20 in a first direction D1 orthogonal to second direction D2. Moreover, word lines WL of memory cell regions 20 are drawn to WL HU regions 22. In WL HU regions 22, the drawn word lines WL are connected to a peripheral circuit (row decoder 12).

Additionally, FIG. 3 shows that the two memory cell regions 20 are present, but one memory cell region or three memory cell regions or more may be present. Moreover, memory cell regions 20 may be arranged along second direction D2. This also applies to BL HU regions 21 and WL HU regions 22.

Next, a sectional structure of memory cell array 11 having the above constitution will be described with reference to FIG. 4. FIG. 4 is a sectional view of memory cell array 11. FIG. 4 shows a case where memory cell array 11 has a four layers structure, i.e., an example where the constitutions of FIG. 2 are stacked in four layers in the direction perpendicular to the surface of the drawing sheet of FIG. 2.

As shown, a peripheral circuit 23 (including row decoder 12, column decoder 13 and the like, except memory cell array 11) is formed on a semiconductor substrate (the silicon substrate) 30. Moreover, memory cell array 11 above peripheral circuit 23 with an interlayer insulating film (not shown) interposed therebetween.

In memory cell region 20 of the first layer, a metal interconnect layer 32 functioning as word line WL is formed on the interlayer insulating film with a barrier metal layer 31 interposed therebetween. Metal interconnect layer 32 is drawn to WL HU region 22. Moreover, metal interconnect layer 32 is electrically connected to peripheral circuit 23 on semiconductor substrate 30 via a contact plug or a metal interconnect layer in WL HU region 22. On metal interconnect layer 32, memory cells MC are formed. Each of memory cells MC has a structure where a barrier metal layer 33-1, a selection element 34-1, a barrier metal layer 35-1, a variable resistance element 36-1 and an electrode 37-1 are sequentially stacked. Hereinafter, a suffix "i" may be attached to a reference mark of each layer of memory cell MC in memory cell region 20 of the i-th layer (i is a natural number of 1 or larger) sometimes. However, when the respective layers are not distinguished, the suffix is not attached. Moreover, a metal interconnect layer 39 functioning as bit line BL is formed so that a plurality of electrodes 37-1 of memory cells MC are connected. A barrier metal layer 38 is formed between electrode 37-1 and bit line BL. Metal interconnect layer 39 also functions as bit line BL of memory cell region 20 of second layer, and is drawn to BL HU region 21. Furthermore, metal interconnect layer 39 is electrically connected to peripheral circuit 23 on semiconductor substrate 30 via a contact plug and a metal interconnect layer in BL HU region 21.

In memory cell region 20 of the second layer, memory cells MC are formed on metal interconnect layer 39 which functions as bit line BL of memory cell region 20 of the first layer. Each of memory cells MC has a structure where a barrier metal layer 33-2, a selection element 34-2, a barrier metal layer 35-2, a variable resistance element 36-2 and an electrode 37-2 are sequentially stacked. Moreover, metal interconnect functioning as word line WL is formed so that electrodes 37-2 of memory cells MC are connected. Barrier metal layer 31 is formed between the electrode 37-2 and word line WL. The metal interconnect layer 32 also functions as word line WL of memory cell region 20 of the third layer. Furthermore, the layer is drawn to WL HU region 22, and is electrically connected to peripheral circuit 23 via a contact plug and a metal interconnect layer.

Hereinafter, memory cell regions 20 of the third layer and the fourth layer also have a similar constitution. It is to be noted that due to limitation of a paper space in FIG. 4, bit lines BL are drawn in parallel with word lines WL, but in actual, bit lines BL are orthogonal to word lines WL.

In the above constitution, the contact plug in each of BL HU region 21 and WL HU region 22 is formed once for the certain number of the layers. Moreover, in each layer, the contact plug is usually connected to an interconnect so that part of the contact plug is hooked. This is because when a contact plug is formed for each layer, the number of steps increases, to raise cost. Therefore, a position of a connecting portion of a certain interconnect to a certain contact plug needs to be shifted from a position of a connecting portion of another interconnect to another contact plug.

In the above constitution, variable resistance element 36 is formed by using, for example, HfOx as a material. A resistance change material represented by HfOx is a material which changes between at least two resistance values, i.e., a low resistance state and a high resistance state. Moreover, it is known that when a voltage above a certain level is applied to the resistance change material of the high resistance state, the material changes to the low resistance state, and that when a current above a certain level flows through the resistance change material of the low resistance state, the material changes to the high resistance state. Variable resistance element 36 can be formed by a thin film including at least one selected from the group consisting of $ZnMn_2O_4$, NiO, $TiO_2$, $SrZrO_3$, $Pr_{0.7}Ca_{0.3}MnO_3$ and carbon, in addition to HfOx.

Selection element 34 is a diode using a pn junction of a semiconductor such as silicon, a tunnel element made of a metal-insulator-metal (MIM) stack structure, or the like. Hereinafter, selection element 34 will be called diode layer 34 or simply called diode 34 sometimes.

2. Regarding Method of Fabricating Memory Cell Array

Next, a method of fabricating memory cell array 11 shown in FIG. 2 to FIG. 4 will be described with reference to FIG. 5 to FIG. 37. Hereinafter, to simplify the description, a case where memory cell array 11 has a double layer structure will be described as an example.

FIG. 5 is a perspective view showing a fabricating step of memory cell array 11. First, as shown in FIG. 5, for example, peripheral circuit 23 which controls the operation of the ReRAN is formed on semiconductor substrate 30, and then an interlayer insulating film 40 is formed on silicon substrate 30 to cover peripheral circuit 23. Continuously, a barrier metal layer 41, a word line film 42, a barrier metal layer 43, a pin diode layer 44, a barrier metal layer 45, a variable resistance film 46, an electrode film 47 and a mask material 48 are sequentially formed on interlayer insulating film 40. Barrier metal layer 41, word line film 42, barrier metal layer 43, pin diode layer 44, barrier metal layer 45, variable resistance film 46 and electrode film 47 correspond to barrier metal layer 31, word line 32, barrier metal layer 33-1, diode 34-1, barrier metal layer 35-1, variable resistance element 36-1 and electrode 37-1 described with reference to FIG. 4, respectively. As an example, barrier metal layer 41 is formed by a TiN film having a film thickness of 5 nm, word line film 42 is formed by a tungsten film having a film thickness of 50 nm, barrier metal layer 43 is formed by a TiN film having a film thickness of 5 nm, diode layer 44 is formed by an amorphous silicon film having a film thickness of 100 nm and having an upper surface and a lower surface provided with a p-type impurity layer and an n-type impurity layer, barrier metal layer 45 is formed by a Ti/TiN film having a film thickness of 5 nm, and electrode film 47 is formed by a tungsten film having a film thickness of 50 nm. Moreover, mask material 48 is formed by an SiN film. Furthermore, barrier metal layer 43, diode layer 44, barrier metal layer 45, variable resistance film 46 and electrode film 47 form the first layer of memory cell array 11.

Next, a mask for patterning word line film 42 is formed by a double patterning technology in which a side wall spacer film is used. That is, as shown in FIG. 5, first in memory cell region 20, a mask material (hereinafter, the core material) 49 having a stripe shape along first direction D1 is formed. Core material 49 is formed by a silicon oxide film having a film thickness of, for example, 150 nm. A method of fabricating core material 49 is as follows. That is, core material 49 is formed on the whole surface of mask material 48. Next, core material 49 is coated with a photoresist, and a pattern is transferred to the photoresist by use of a photolithography technology. A pitch of this pattern is twice as large as a pitch of word lines WL. Moreover, Core material 49 is etched using this photoresist as the mask. Continuously, the slimming of core material 49 is performed by a wet treatment using an HF solution. As a result, a line width of core material 49 is set to a desirable bit line width.

FIG. 6 is a plan view of memory cell array 11, and especially shows a planar pattern of core material 49. Additionally, FIG. 5 corresponds to a structure of an area A1 in FIG. 6 seen from an arrow direction in the drawing. This also applies to perspective views for use in the present embodiment. As shown, core material 49 is drawn from memory cell region 20 to WL HU region 22. Moreover, one end of core material 49 is connected to one end of the other core material 49 in WL HU region 22. In other words, one core material 49 has a folded pattern (or bent pattern). That is, the one core material 49 has such a shape that the material runs from the one WL HU region 22 through memory cell region 20 to the other WL HU region 22, is further returned at this WL HU region 22, and again runs through memory cell region 20 to return to the original WL HU region 22.

Additionally, FIG. 6 illustrates a case where core material 49 of a linear pattern is formed on an inner side of core material 49 having the folded pattern. However, this is merely one example, and core material 49 of the linear pattern may be replaced with core material 49 of the folded pattern.

Moreover, core material 49 is also formed in BL HU region 21. Core material 49 of BL HU region 21 forms a dummy memory cell structure, and is disposed at a position overlapping with a returned portion of bit line BL. This respect will also be described later in detail. Needless to say, core material 49 of BL HU region 21 may be disposed not only to form the dummy memory cell structure but also to form a required interconnect.

Figure 7:
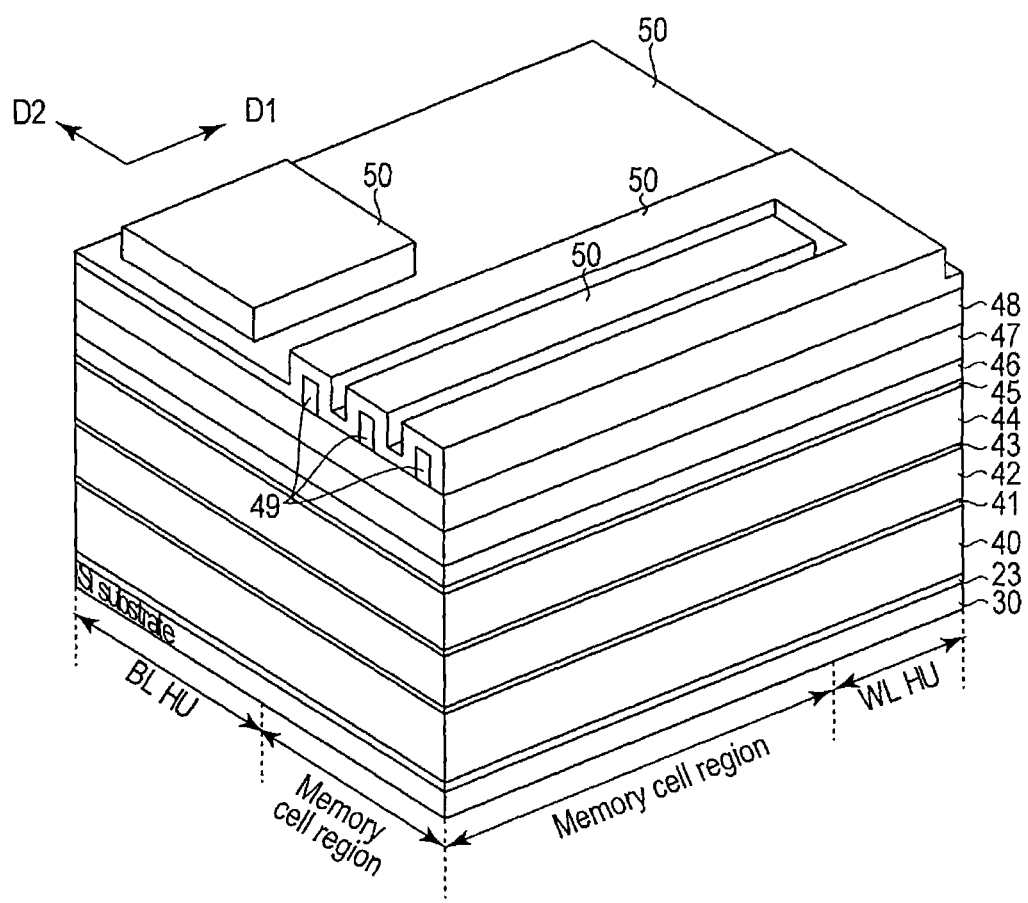

Next, as shown in FIG. 7, a mask material (hereinafter, the side wall material) 50 is formed on the mask material 48 and the core material 49 by using, for example, an amorphous silicon layer.

Figure 8:
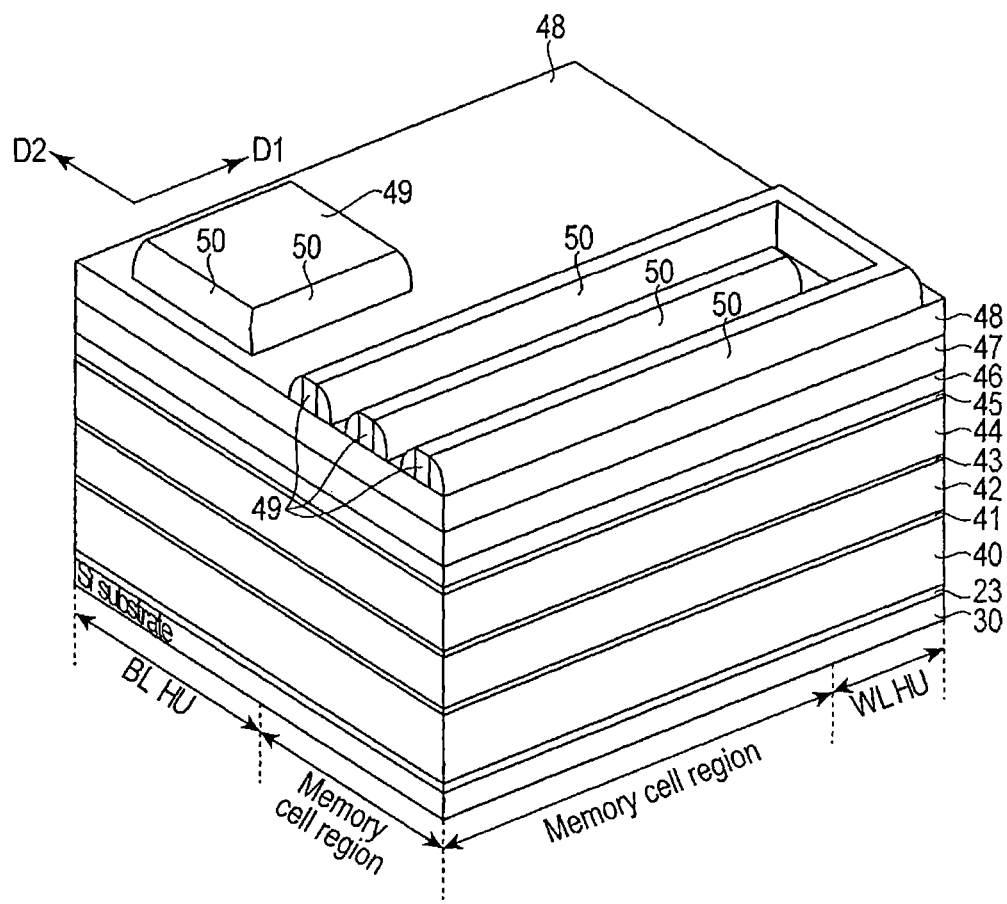

Continuously, as shown in FIG. 8, side wall material 50 is etched back so that side wall material 50 having a film thickness which is a half of the pitch of word lines WL remains only on each side wall of core material 49.

Next, as shown in FIG. 9, core material 49 and side wall material 50 of BL HU region 21 are coated with a photoresist 51, and in this state, the HF wet treatment is performed. In consequence, core material 49 of memory cell region 20 is removed, so that side wall material 50 remains.

Next, as shown in FIG. 10, after peeling off photoresist 51 of BL HU region 21, mask material 48 is etched by using side wall material 50 as a mask, and then side wall material 50 is removed. As a result of the above double patterning technology, as shown in FIG. 10, a mask pattern having a line width which corresponds to the film thickness of amorphous silicon layer 50 and is smaller than a minimum limitation of photolithography can be formed in memory cell region 20. On the other hand, a mask pattern having a larger width than memory cell region 20 is formed in BL HU region 21.

Additionally, in this stage, the two mask materials 48 in memory cell region 20 are connected in WL HU region 22. In other words, each of mask materials 48 has a returned pattern at one of WL HU regions 22. Therefore, the one mask material 48 needs to be separated at a returned position of the material. However, this separation step is not performed in this stage (hereinafter, the separation step will be called the loop cut, and a region where the loop cut is performed will be called the loop cut region).

Next, as shown in FIG. 11, etching by use of mask material 48 as the mask, for example, reactive ion etching (RIE) is performed, to collectively pattern electrode film 47, variable resistance film 46, barrier metal layer 45, diode layer 44, barrier metal layer 43, word line film 42, and barrier metal layer 41. Consequently, in memory cell region 20, word lines WL of the stripe shape along first direction D1 are formed. Moreover, in BL HU region 21, a dummy memory cell structure DM1 having a similar stack structure is formed. Needless to say, in this stage, word lines WL have a returned pattern at WL HU region 22.

Next, as shown in FIG. 12, mask material 48 is removed. Then, a coating type interlayer insulating film 52 of, for example, polysilazane (PSZ) is formed on interlayer insulating film 40. Consequently, groove portions made in the step of FIG. 11 are filled with interlayer insulating film 52. Afterward, by a chemical mechanical polishing (CMP) process or the like, interlayer insulating film 52 is flattened, to expose the upper surface of electrode film 47.

Figure 13:
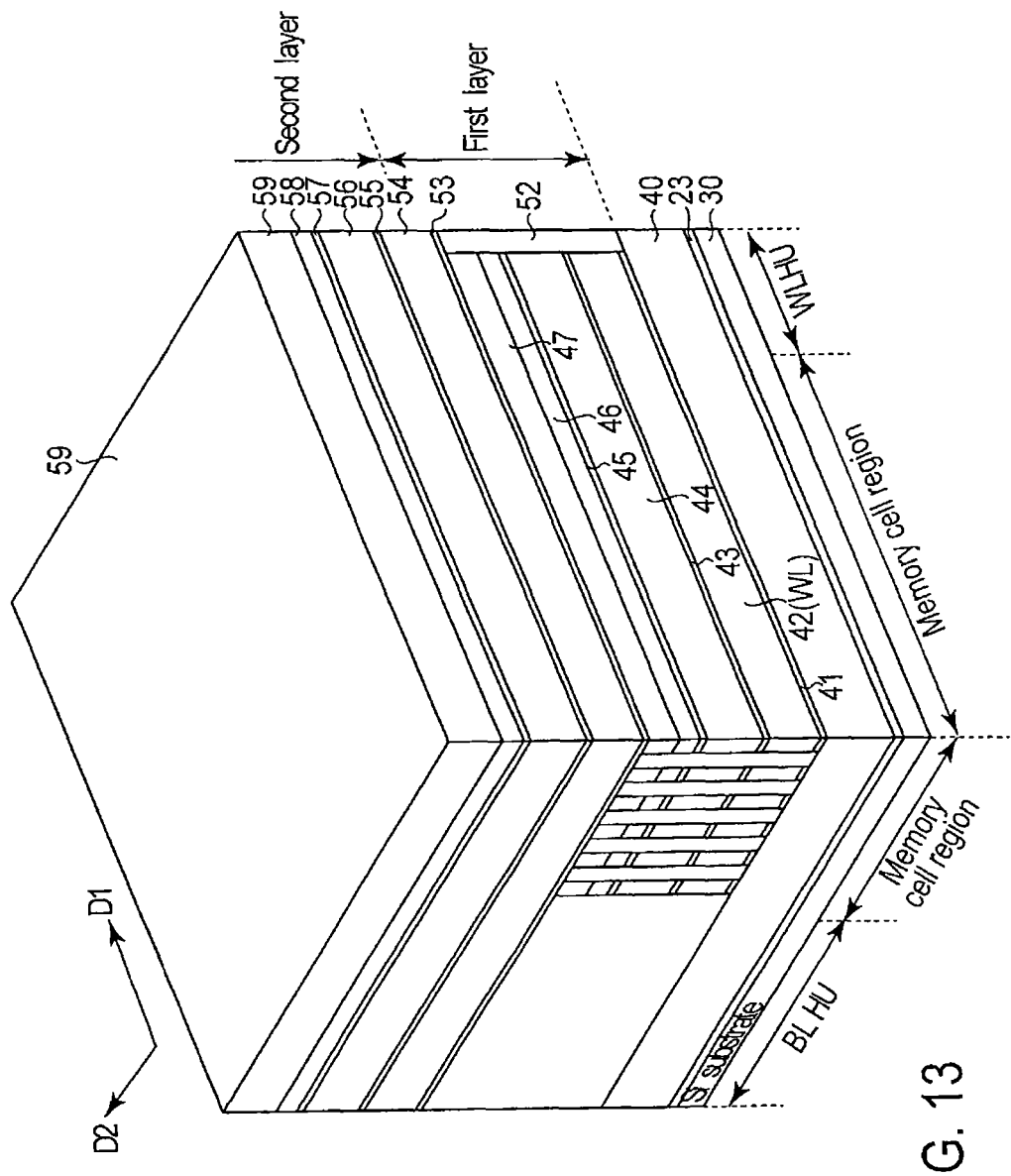

Next, as shown in FIG. 13, a barrier metal layer 53, a bit line film 54, a barrier metal layer 55, a pin diode layer 56, a barrier metal layer 57, a variable resistance film 58, and an electrode film 59 are sequentially formed on electrode film 47 and interlayer insulating film 52. These films correspond to barrier metal layer 38, bit line 39, barrier metal layer 33-2, diode 34-2, barrier metal layer 35-2, variable resistance element 36-2 and electrode 37-2 described with reference to FIG. 4, respectively. Moreover, materials and film thicknesses of barrier metal layer 53, bit line film 54, barrier metal layer 55, diode layer 56, barrier metal layer 57 and electrode film 59 are similar to those of barrier metal layer 41, word line film 42, barrier metal layer 43, diode layer 44, barrier metal layer 45 and electrode film 47. Furthermore, barrier metal layer 55, diode layer 56, barrier metal layer 57, variable resistance film 58 and electrode film 59 form the second layer of memory cell array 11.

Figure 14:
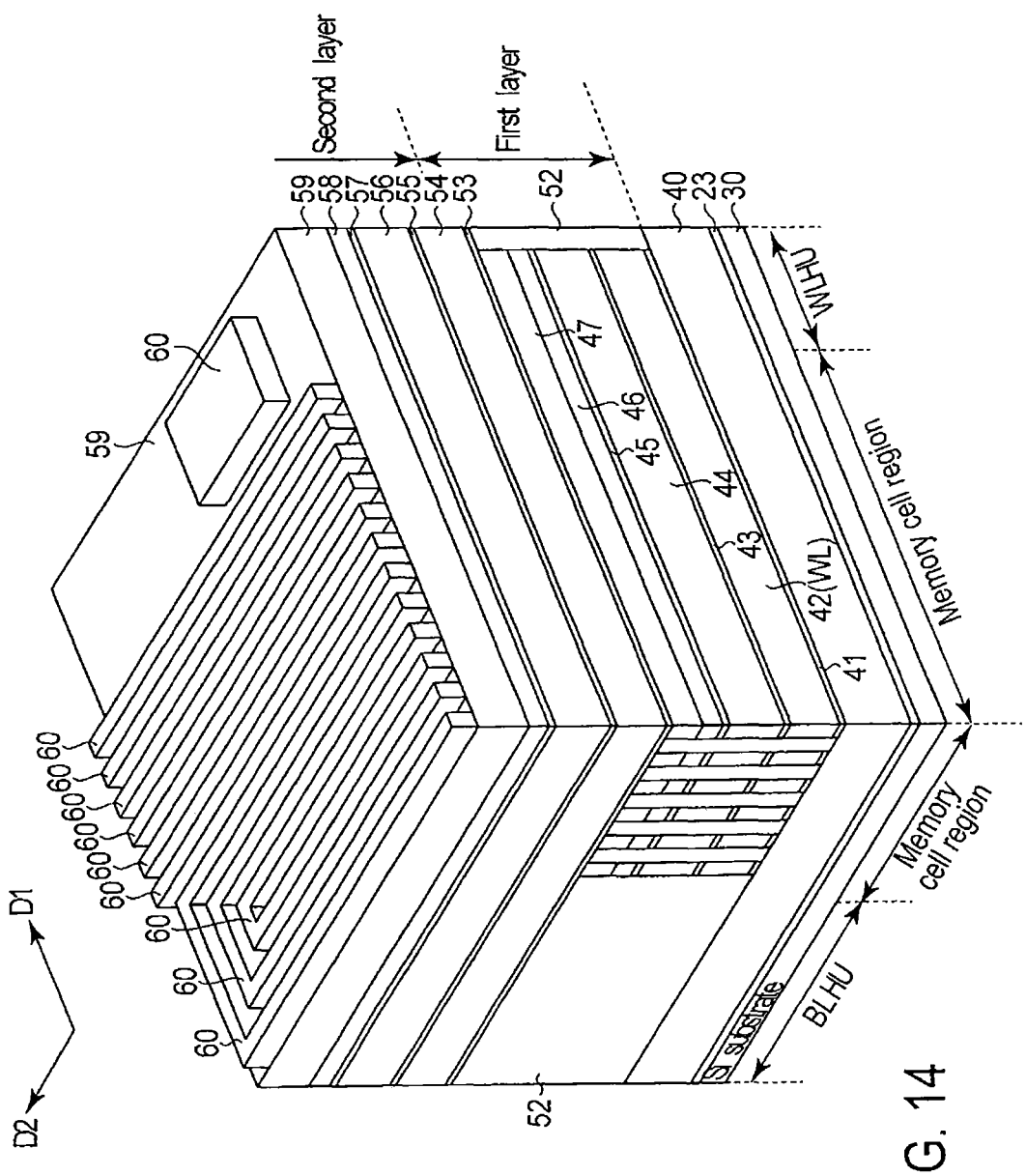
Figure 15:
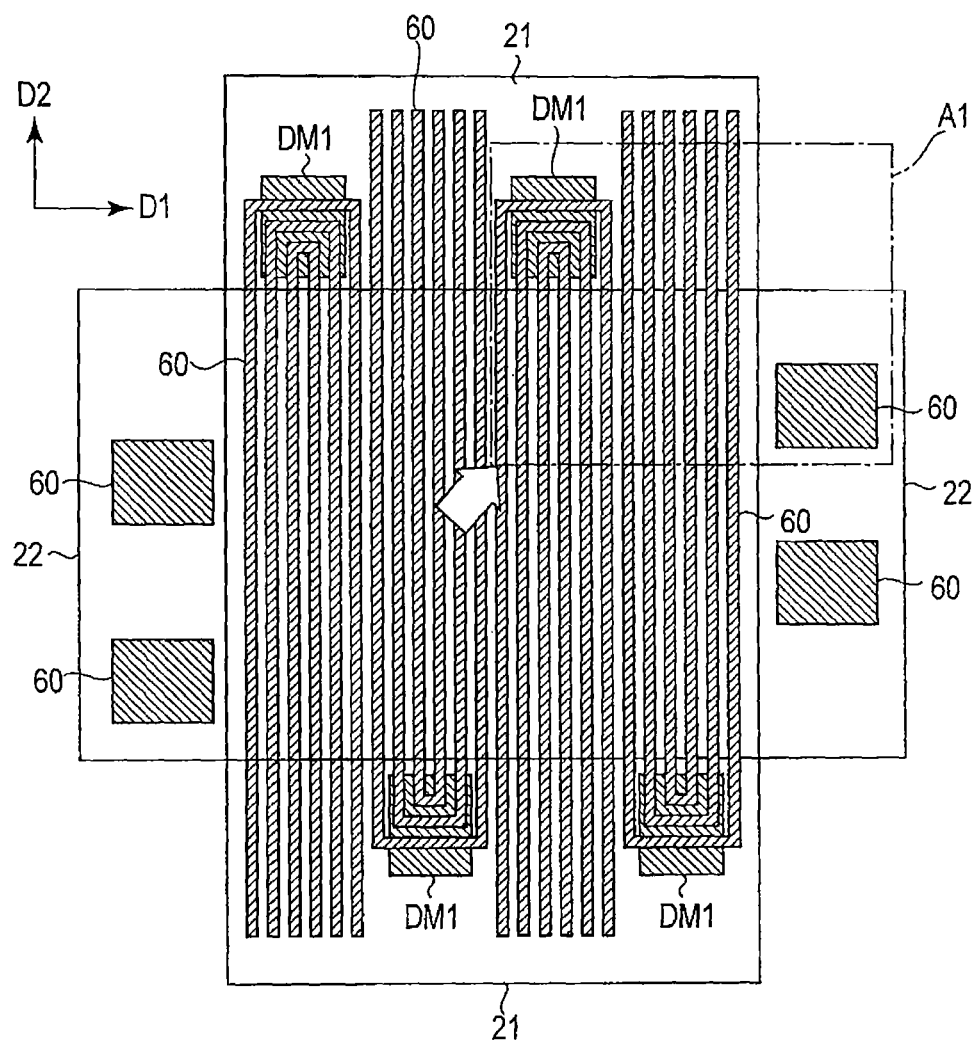

Next, a mask material for forming bit lines BL is formed by using the double patterning technology described with reference to FIG. 5 to FIG. 10. That is, as shown in FIG. 14 and FIG. 15, a mask material 60 of a stripe shape along second direction D2 is formed on electrode film 59. FIG. 15 is a plan view of memory cell array 11, and shows the patterned mask material 60 and dummy memory cell structure DM1 present in a layer lower than the patterned mask material 60. FIG. 14 corresponds to a structure of area A1 of FIG. 15 seen from the arrow direction. As shown, mask material 60 has a returned pattern at BL HU region 21 in the same manner as in mask material 48 for forming word lines WL described with reference to FIG. 10. In this case, a region of mask material 60 which corresponds to the loop cut region of bit line BL is formed to overlap with dummy memory cell structure DM1 formed as shown in FIG. 11. This is shown in FIG. 16. FIG. 16 shows a partial area of BL HU region 21. Additionally, in FIG. 16, the four mask materials 60 of the folded pattern are drawn, but this number of the materials is merely an arbitrary example.

Moreover, mask material 60 is also formed in WL HU region 22. Mask material 60 formed in WL HU region 22 is for forming the dummy memory cell structure, and is disposed at a position overlapping with the loop cut region of word lines WL (word line film 42 of FIG. 11). This is shown in FIG. 17. FIG. 17 shows a partial area of WL HU region 22.

Next, as shown in FIG. 18, the etching by use of the mask material 60 as the mask, for example, the reactive ion etching is performed, to collectively pattern the electrode film 59, the variable resistance film 58, the barrier metal layer 57, the diode layer 56, the barrier metal layer 55, the bit line film 54, the barrier metal layer 53, the electrode film 47, the variable resistance film 46, the barrier metal layer 45, the diode layer 44, and the barrier metal layer 43 are etched by the etching, for example, the reactive ion etching, using mask material 60 as the mask. Consequently, bit lines BL of a stripe shape along second direction D2 are formed. Moreover, in the present step, electrode film 47, variable resistance film 46, barrier metal layer 45, diode layer 44 and barrier metal layer 43 are separated for each of memory cells MC.

In addition, owing to the presence of mask material 60 in WL HU region 22, a dummy memory cell structure DM2 having a stack structure including electrode film 59, variable resistance film 58, barrier metal layer 57, diode layer 56, barrier metal layer 55, the bit line film 54, barrier metal layer 53, electrode film 47, variable resistance film 46, barrier metal layer 45, diode layer 44, and barrier metal layer 43 is formed. Bit line film 54, barrier metal layer 53, electrode film 47, variable resistance film 46, barrier metal layer 45, diode layer 44 and barrier metal layer 43 included in dummy memory cell structure DM2 include the loop cut region of word lines WL of the first layer.

Next, as shown in FIG. 19, after removing mask material 60, for example, a coating type interlayer insulating film 61 is formed on the substrate, to fill the grooves made in the step of FIG. 18, thereby flattening the upper surface of the interlayer insulating film. In consequence, the upper surface of electrode film 59 is exposed.

Figure 20:
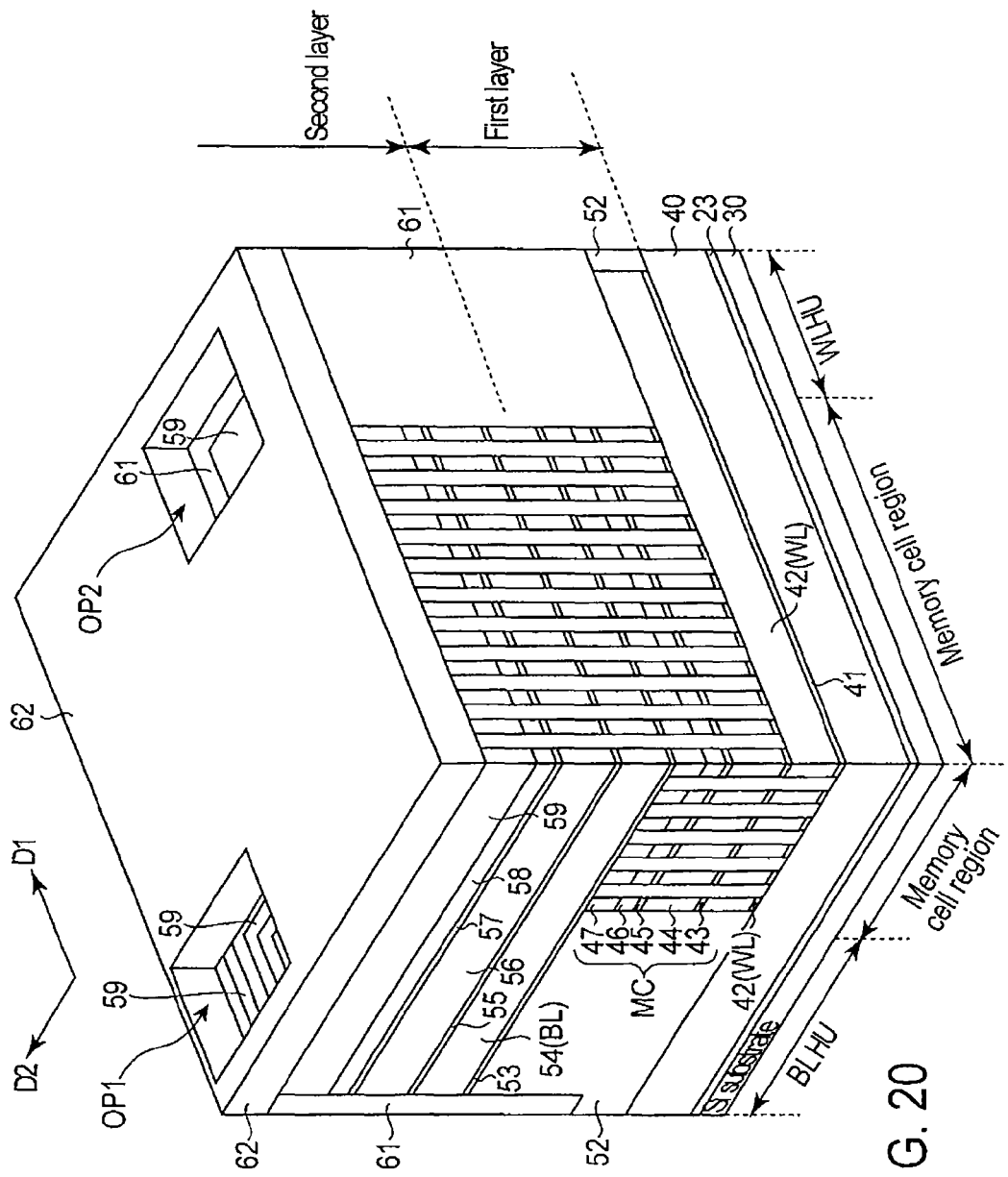
Figure 24:
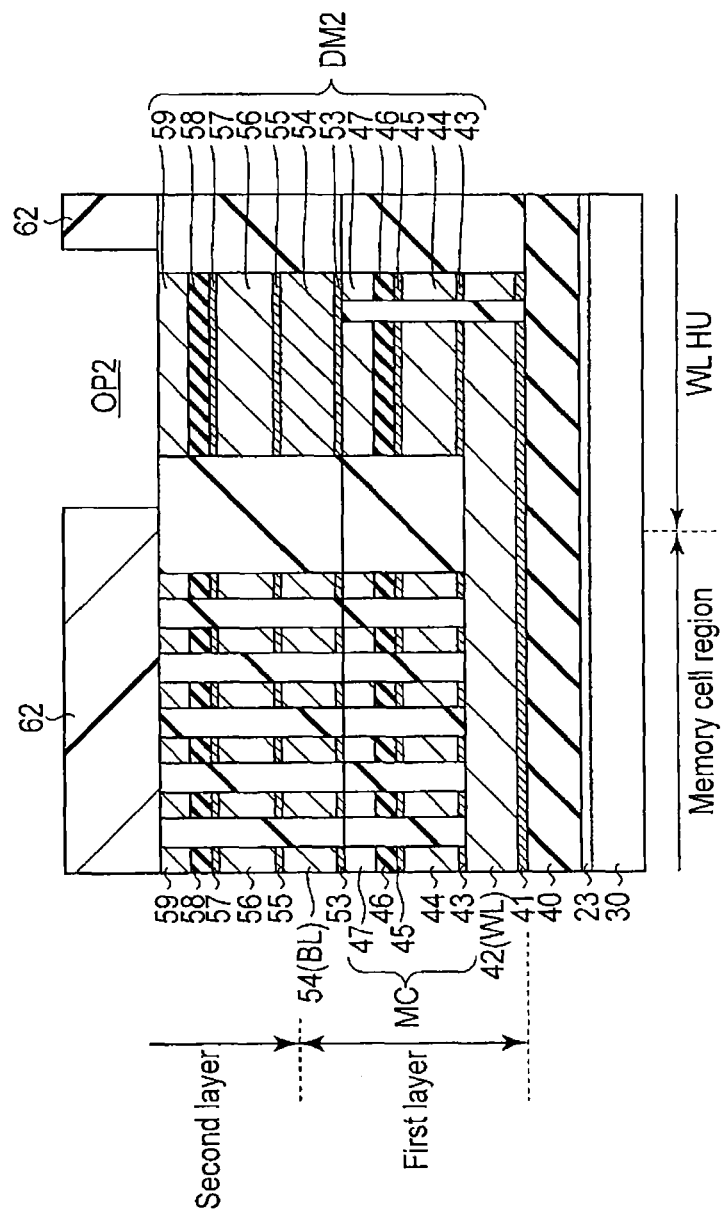

Next, the loop cut of bit line film 54 is performed. In this case, the loop cut of word line film 42 is simultaneously performed. First, the loop cut process will be described with reference to FIG. 20 to FIG. 24. FIG. 20 is a perspective view of memory cell array 11. FIG. 21 is a plan view of BL HU region 21, and especially shows a positional relation between each of bit lines BL and dummy memory cell structure DM1. FIG. 22 is a plan view of WL HU region 22, and especially shows a positional relation between each of word lines WL and dummy memory cell structure DM2. FIG. 23 is a sectional view of memory cell array 11 along the second direction, and corresponds to a sectional view along the 23-23 line of FIG. 21. FIG. 24 is a sectional view of memory cell array 11 along the first direction, and corresponds to a sectional view along the 24-24 line of FIG. 21.

As shown, the structure completed in FIG. 19 is coated with a photoresist 62. Then, photoresist 62 in each loop cut region of word lines WL and bit lines BL is removed by the photolithography technology. Consequently, an opening OP1 is made in photoresist 62 in the loop cut region of bit line BL, and an opening OP2 is made in photoresist 62 in loop cut region of word lines WL. In this case, as shown in FIG. 21 and FIG. 22, when seen from the upper surface, openings OP1 and OP2 are disposed so that the whole dummy memory cell structure DM1 is contained in opening OP1 and dummy memory cell structure DM2 is contained in opening OP2. Therefore, in opening OP1, a returned portion of electrode film 59 is exposed. In opening OP2, rectangular electrode film 59 is exposed.

Next, etching by using photoresist 62 as the mask is performed. This is shown in FIG. 25 to FIG. 29. FIG. 25 to FIG. 29 show the same regions as in FIG. 20 to FIG. 24. As shown, by the reactive etching or the like, the etching is collectively performed from the upper surface of interlayer insulating film 61 to the lower surface of barrier metal layer 41 (upper surface of interlayer insulating film 40). Consequently, in BL HU region 21, bit line film 54 is loop-cut, and all dummy memory cell structures DM1 are removed (see FIG. 26 and FIG. 28). Moreover, in WL HU region 22, word line film 42 is loop-cut, and all dummy memory cell structures DM2 are removed (see FIG. 27 and FIG. 29).

Figure 30:
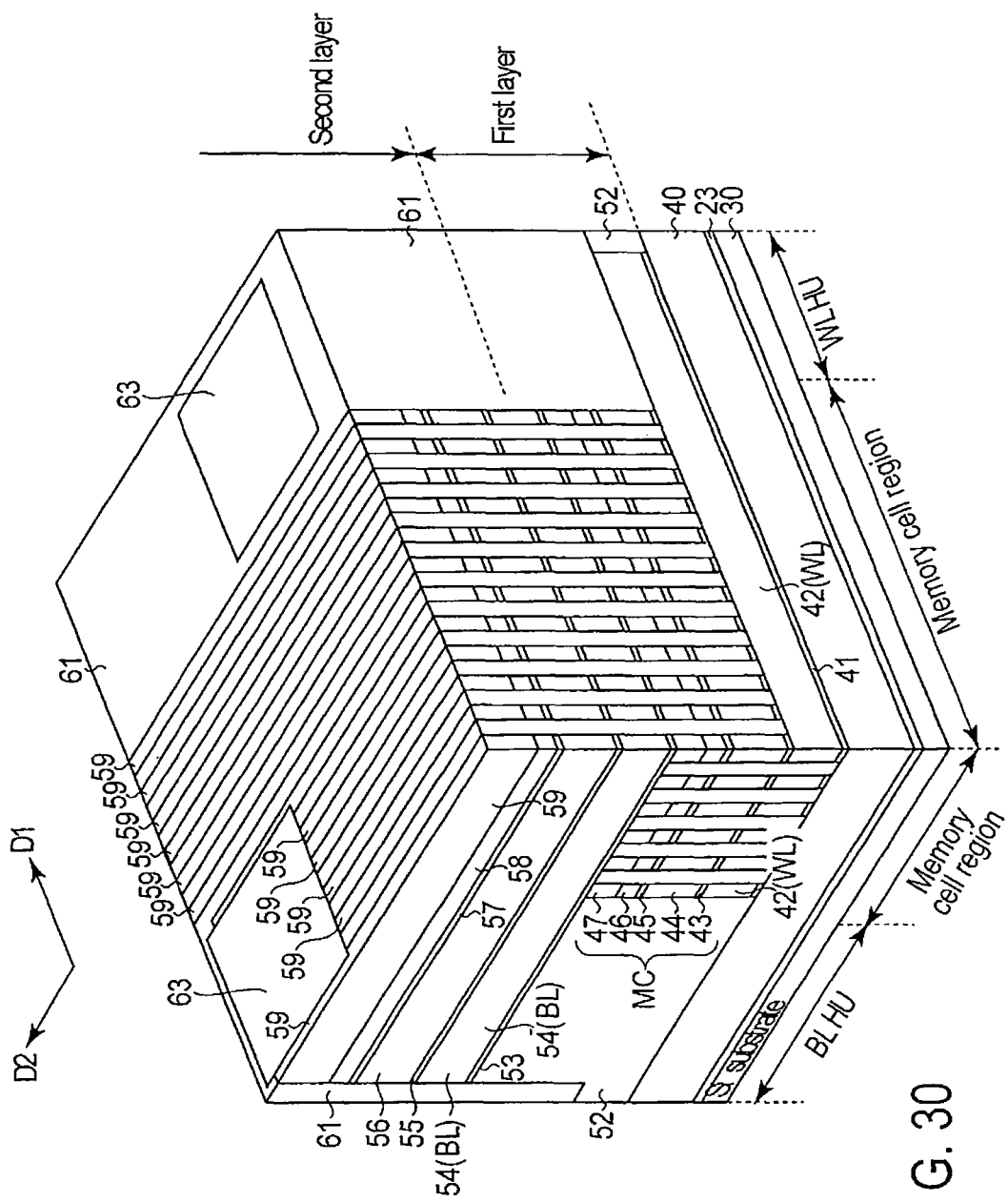

In the above steps, the loop cut is performed. Next, as shown in FIG. 30 to FIG. 32, after removing photoresist 62, a coating type interlayer insulating film 63 of polysilazane or the like is formed on interlayer insulating film 61, to fill grooves made in the steps of FIG. 25 to FIG. 29. Afterward, interlayer insulating film 63 is flattened by the CMP process, to expose the upper surface of electrode film 59. In consequence, interlayer insulating film 63 remains only in the grooves of the loop cut region. Additionally, FIG. 31 and FIG. 32 are sectional views showing the same regions as in FIG. 28 and FIG. 29, respectively.

Figure 33:
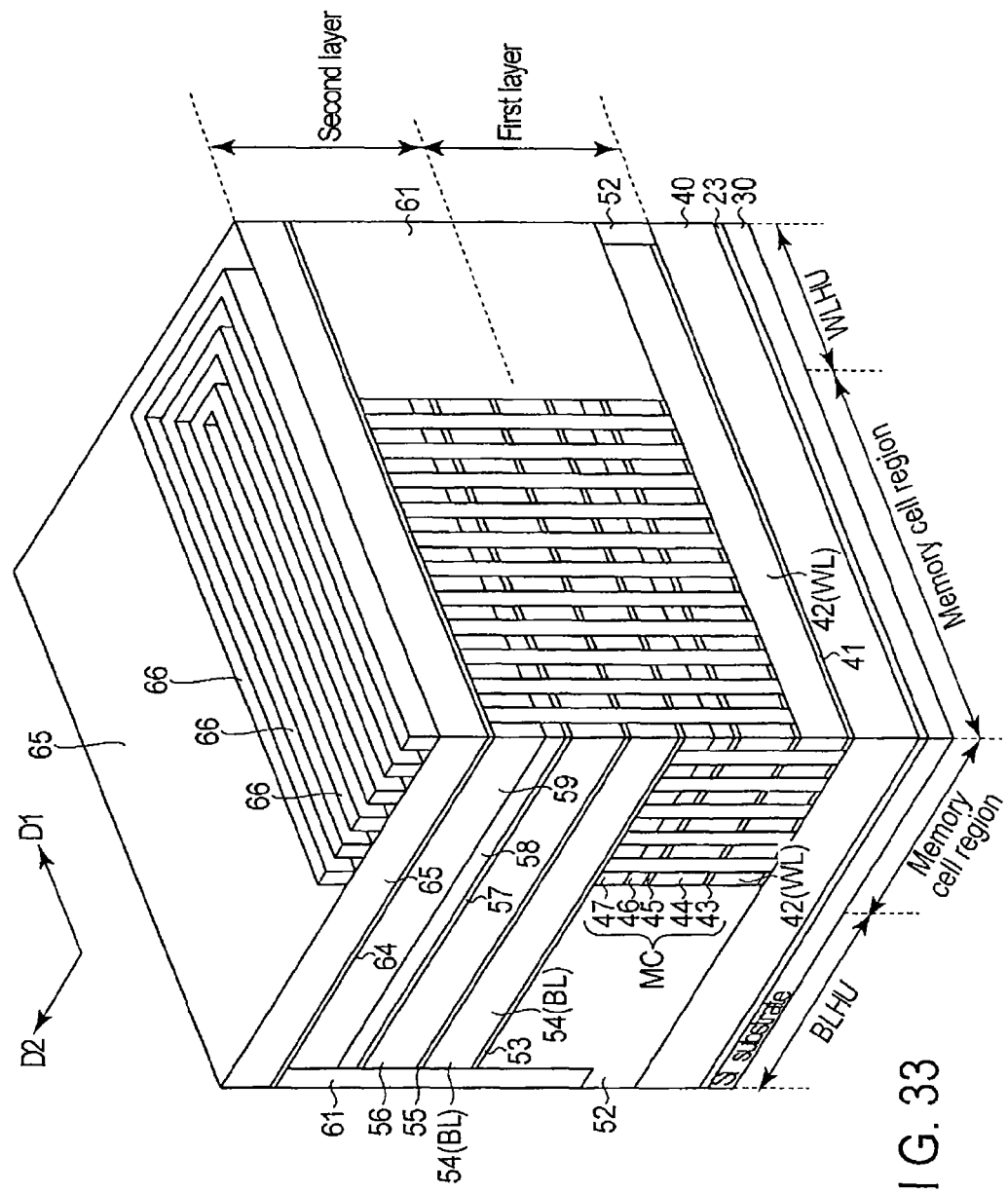

Next, as shown in FIG. 33, a barrier metal layer 64 and a word line film 65 are formed on electrode film 59 and interlayer insulating films 61 and 63. These films correspond to barrier metal layer 31 and word lines 32 of the second layer of memory cell array 11 in FIG. 4, and materials and film thicknesses of the films are similar to those of barrier metal layer 41 and word line film 42. Continuously, a word line patterning mask material 66 is formed on word line film 65 by the double patterning technology.

Figure 34:
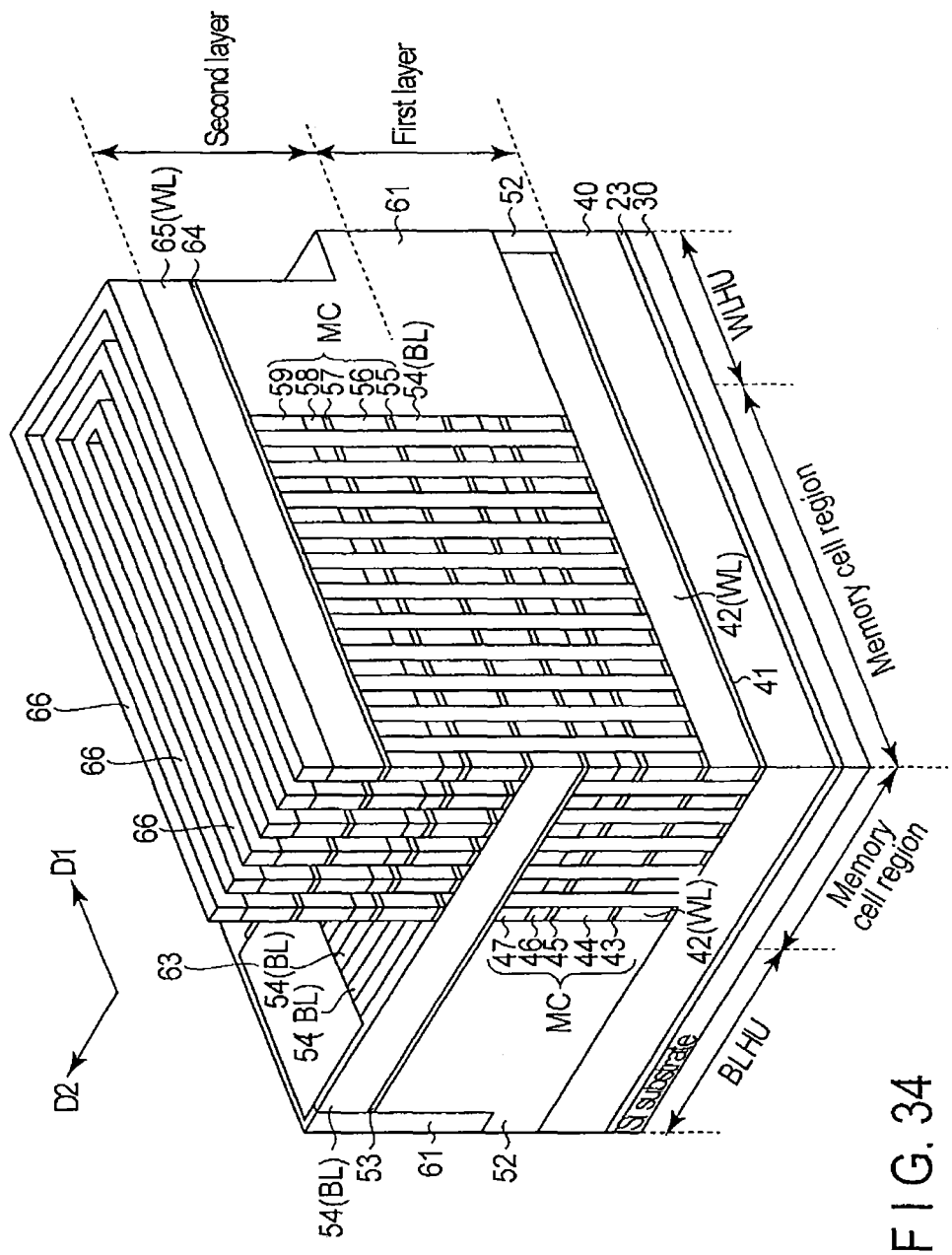
Figure 35:
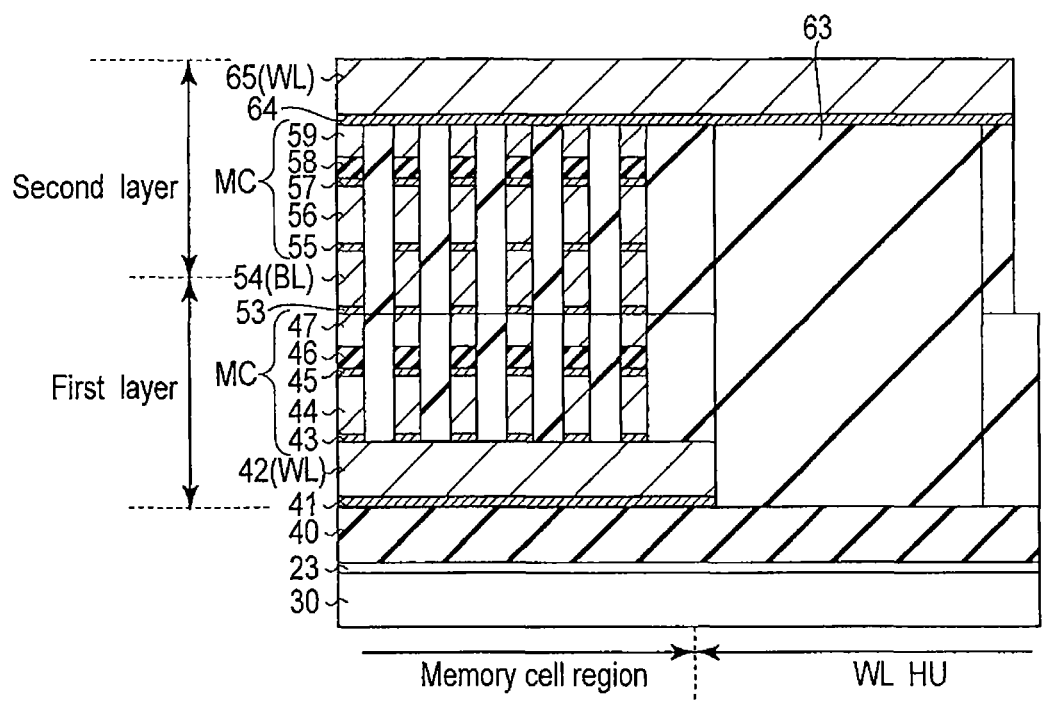

Next, as shown in FIG. 34 and FIG. 35, etching using mask material 66 as the mask, for example, the reactive ion etching is performed. FIG. 34 is a perspective view of memory cell array 11, and FIG. 35 is a sectional view of a region including a word line loop cut region along first direction D1. As shown, word line film 65, barrier metal layer 64, electrode film 59, variable resistance film 58, barrier metal layer 57, diode layer 56 and barrier metal layer 55 are collectively patterned. Consequently, word lines WL (word lines of the second layer) of the stripe shape along first direction D1 are formed. Moreover, in the present step, electrode film 59, variable resistance film 58, barrier metal layer 57, diode layer 56 and barrier metal layer 55 are separated for each of memory cells MC. That is, memory cells MC of memory cell array 11 of the second layer are completed.

Next, as shown in FIG. 36 and FIG. 37, the loop cut of word lines WL of the second layer is performed. FIG. 36 is a perspective view of memory cell array 11, and FIG. 37 is a sectional view of a region including a word line loop cut region along first direction D1. As shown, after removing mask material 66, for example, a coating type interlayer insulating film 67 is formed on the whole surface, to fill grooves made in the steps of FIG. 34 and FIG. 35, thereby flattening the upper surface of interlayer insulating film 67. In consequence, the upper surface of word line film 65 is exposed. Afterward, the whole surface is coated with a photoresist, and word line film 65 in the loop cut region is removed by the photolithography technology and the reactive etching. Afterward, the loop cut region is filled with an interlayer insulating film 68.

According to the above steps, memory cell array 11 of a double layer structure is completed. It is to be noted that when the above fabricating steps are repeated, memory cell array 11 of three layers or more can be fabricated.

3. Effects According to Present Embodiment

As described above, the fabricating steps of the semiconductor memory device can be simplified according to the present embodiment. Hereinafter, the present effects will be described in order.

3.1 Regarding ReRAM

As to a conventional nonvolatile semiconductor memory (the EEPROM) in which a floating gate is used, it is difficult to miniaturize the memory after a 20 several nm generation. Therefore, as a candidate for the nonvolatile semiconductor memory in which further capacity enlargement is possible, three-dimensional cross point cells are expected. In such memories, the ReRAM using the variable resistance element is a strong candidate for the next-generation nonvolatile semiconductor memory.

Each of the cross point cells of the ReRAM includes a diode and a variable resistance between orthogonal interconnects (the word line and the bit line), and the cells are three-dimensionally arranged in an array. When a voltage is applied to the variable resistance element, at a predetermined voltage (Vset), the variable resistance element changes to the low resistance state where the resistance value lowers as much as one or two digits. This is called SET (write). Moreover, when the voltage is applied to the variable resistance element of the low resistance state so that a current flows, the variable resistance element changes to the high resistance state at a predetermined voltage (Vreset). This is called RESET (erase). The low resistance state and the high resistance state are detected by a flowing current difference, and "0" data and "1" data held by the memory cells are detected.

Moreover, for semiconductor memories after a 30 several nm generation, resolution is difficult by an exposure technology using a conventional ArF laser. Therefore, the double patterning technology using the side wall spacer film is usually used.

3.2 Problems

Such a conventional ReRAM fabricating method has the following problems.

First, the number of required exposure times is large. That is, to prepare the interconnects of one layer, three exposure times are required: 1) the formation of a usual resist pattern in a double patterning step; 2) the formation of the resist pattern when the mask materials of the hookup region and the memory cell region are separately prepared; and 3) the loop cut. Especially in the three-dimensional cross point type memory, the number of the exposure times corresponding to the number of the stacked layers is required, the number of the exposure times noticeably increases, and it is difficult to decrease cost.

Moreover, an area of the hookup region increases. In the double patterning technology, the mask material functioning as the core material is removed by the wet treatment (see FIG. 9). In this case, the hookup region is coated with the photoresist, but a wet solution permeates the hookup region from a photoresist boundary owing to isotropic etching characteristics of the wet treatment. Therefore, in consideration of this wet solution permeating region, it is necessary to acquire a region of about 0.3 to 0.4 μm as a margin.

In the three-dimensional memory, to connect the word and bit lines to a driver, it is necessary to dispose the hookup regions as many as the stacked interconnect layers. Furthermore, in the ReRAM, the memory cell array is divided into small regions (memory cell regions 20 of FIG. 3), and each of the regions needs to be provided with the hookup region and separately driven. This is because each memory cell of the ReRAM has a structure where the variable resistance element and the diode are connected in series. That is, when a very large number of memory cells are connected to one interconnect, a total amount of an off-leak current of each diode increases, even if a reverse bias is applied to the diode.

That is, in the ReRAM, the number of the hookup regions of each interconnect is proportional to "(the number of the stacked layer interconnects)×(the number of memory cell regions 20)". Therefore, even when an area increase per portion is from about 0.3 to 0.4 μm, the increase is an explosive area increase for the whole memory device, and cost rise becomes a large problem.

Moreover, in each hookup region, a dummy region is required to prevent dishing at the CMP (e.g., see FIG. 12). FIG. 38 is a plan view of the memory cell region and the WL HU region in any one of the layers of the memory cell array. In a region where any interconnects are not present, the dishing might occur at the CMP. Therefore, it is necessary to dispose a dummy memory cell structure DM10 as shown in FIG. 38. Furthermore, when the area of the hookup region increases, the area of the required dummy region also increases, and a ratio of the hookup region to the memory cell region increases all the more. Such a vicious cycle is disadvantageously created.

3.3 Present Embodiment

However, the fabricating method according to the present embodiment can solve the above problems.

First, the number of the exposure times for the loop cut can be decreased. In the fabricating method according to the present embodiment, the loop cut of word lines WL is not performed in the steps of FIG. 10 and FIG. 11, and the loop cut of word lines WL is also performed at the loop cut of bit lines BL described with reference to FIG. 20 to FIG. 29. That is, loop cut operations of two interconnects are simultaneously performed. Therefore, the number of the exposure times for the loop cut can be decreased to about a half of the number in the conventional example, i.e., ½ of the number of the layers of the memory cell array 11. Therefore, the fabricating steps can be simplified, and fabricating cost can be decreased.

Furthermore, it is possible to decrease the area of the dummy region for preventing the dishing. In the present embodiment, dummy memory cell structure DM1 suppresses the dishing in the CMP step of FIG. 12, and dummy memory cell structure DM2 suppresses the dishing in the CMP step of FIG. 19. Moreover, in the fabricating method according to the present embodiment, during the loop cut of the bit lines, not only the loop cut of the word lines but also the removing of dummy memory cell structures DM1 and DM2 are performed. In this case, the loop cut region of the bit lines completely overlaps with dummy memory cell structure DM1. More specifically, as shown in FIG. 21 and FIG. 23, and FIG. 26 and FIG. 28, all dummy memory cell structures DM1 are contained in the loop cut region. Similarly, the loop cut region of the word lines completely overlaps with dummy memory cell structure DM2. More specifically, as shown in FIG. 22 and FIG. 24, and FIG. 27 and FIG. 29, all dummy memory cell structures DM2 are contained in the loop cut region. In consequence, the occupying areas of dummy memory cell structures DM1 and DM2 can be cut.

Figure 39:
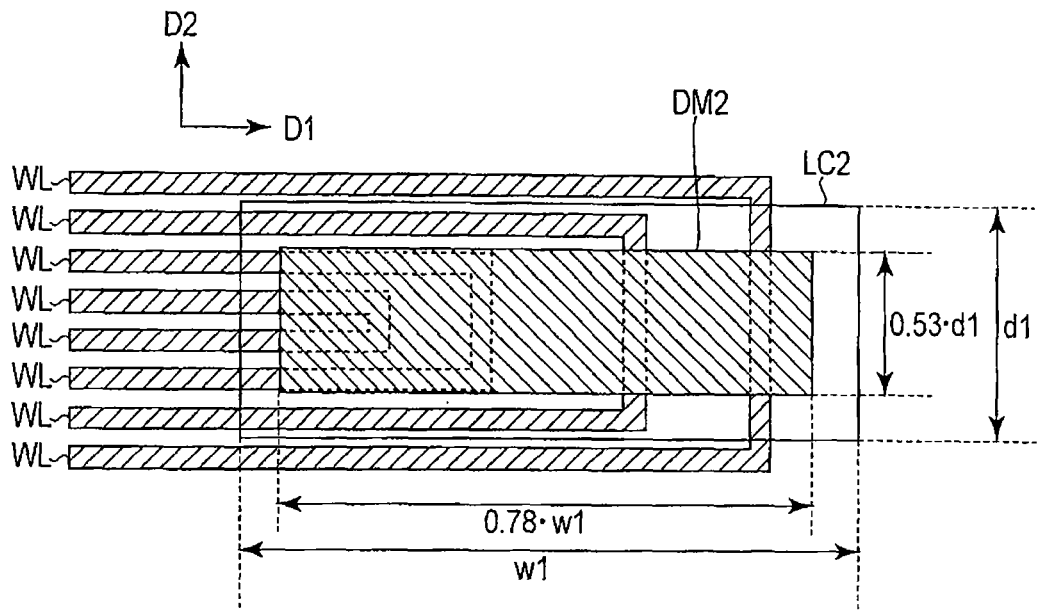
FIG. 39 is a plan view of the word line hookup region according to the one embodiment.

Each of dummy memory cell structures DM1 and DM2 has a size set in consideration of an alignment fluctuation, a dimensional fluctuation, a processing conversion difference and fluctuation, an interlayer film thickness fluctuation, and the like for the exposure of the loop cut (e.g., KrF laser). FIG. 39 is a plan view of word lines WL, dummy memory cell structure DM2, and a word line loop cut region LC2 (i.e., opening OP2 in FIG. 22) as one example.

According to a certain design example, vertical and lateral sizes of dummy memory cell structure DM2 are 0.53·d1 and 0.78·w1, respectively, in which d1 and w1 are the vertical and lateral sizes of loop cut region LC2. Moreover, the dummy region as a whole can be decreased by 17% as compared with the conventional example. This also applies to dummy memory cell structure DM1.

3.4 Modification of Present Embodiment 3.4.1 First Modification

Figure 40:
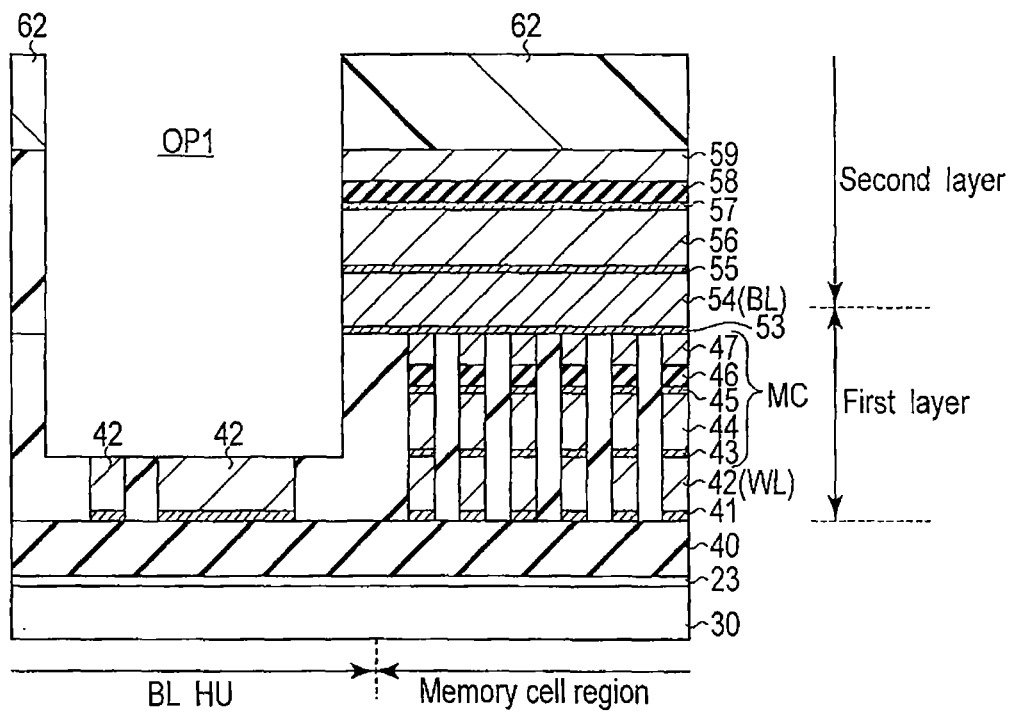
FIG. 40 and FIG. 41 are sectional views showing fabricating steps of a semiconductor memory device according to a modification of the one embodiment, respectively.
Figure 41:
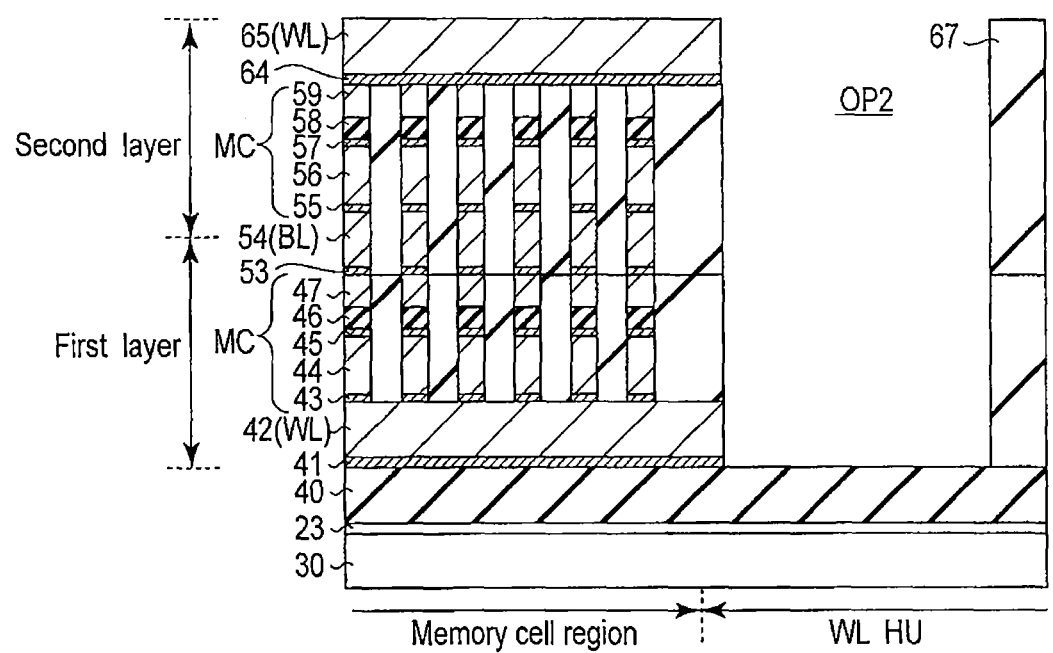

In the above embodiment, portions under word lines WL are etched in the steps of FIG. 25 to FIG. 29, to remove word line film 42 and barrier metal layer 41 exposed in openings OP1 and OP2. However, as shown in FIG. 40, the etching may be stopped at the upper surface of word line film 42. FIG. 40 corresponds to the area shown in FIG. 28. That is, word line film 42 and barrier metal layer 41 may remain. Furthermore, the word line loop cut may be performed simultaneously at the loop cut of word line film 65 after the steps of FIG. 34 and FIG. 35. FIG. 41 shows that the WL loop cut of the first and second layers are collectively performed, and corresponds to the area shown in FIG. 37.

3.4.2 Second Modification

In the above embodiment, there has been described the case where both the BL HU region 21 and the WL HU region 22 are provided with dummy memory cell structures DM1 and DM2, respectively. However, any one of the structures may only be formed.

When dummy memory cell structure DM1 is not formed in BL HU region 21, core material 49 may not be formed in BL HU region 21 in the step of FIG. 5. When dummy memory cell structure DM2 is not formed in WL HU region 22, mask material 60 may not be formed in WL HU region 22 in the step of FIG. 14.

In particular, when the interconnect of the uppermost layer of the memory cell array is processed, the formation of the dummy memory cell structure may be omitted. For example, according to the fabricating steps described in the above embodiment, word line film 65 is the interconnect of the uppermost layer of memory cell array 11. In this case, the formation of the dummy memory cell structure DM2 immediately under word line film 65 may be omitted. This is because any memory cells MC are not present above the uppermost layer of memory cell array 11. Moreover, an interconnect rule (concentration) of the present interconnects is considerably loose as compared with memory cell region 20. Therefore, even when the dishing occurs to a certain degree in the step of FIG. 36, there are not especially any problems.

3.4.3 Third Modification

According to the fabricating method described in the above embodiment, dummy memory cell structure DM1 of BL HU region 21 is present below bit line film 54. Conversely, dummy memory cell structure DM2 of WL HU region 22 is present above word line film 42.

However, this positional relation may be reverse. This corresponds to a case where bit lines BL and word lines WL are replaced in the above description. That is, when the interconnect layers 42 and 65 function as bit lines BL and interconnect layer 54 functions as word lines WL, the positional relation becomes reverse. That is, dummy memory cell structure DM1 of BL HU region 21 is present above the bit lines, and dummy memory cell structure DM2 of WL HU region 22 is present below the word lines.

[Modifications, etc.]

Figure 25:
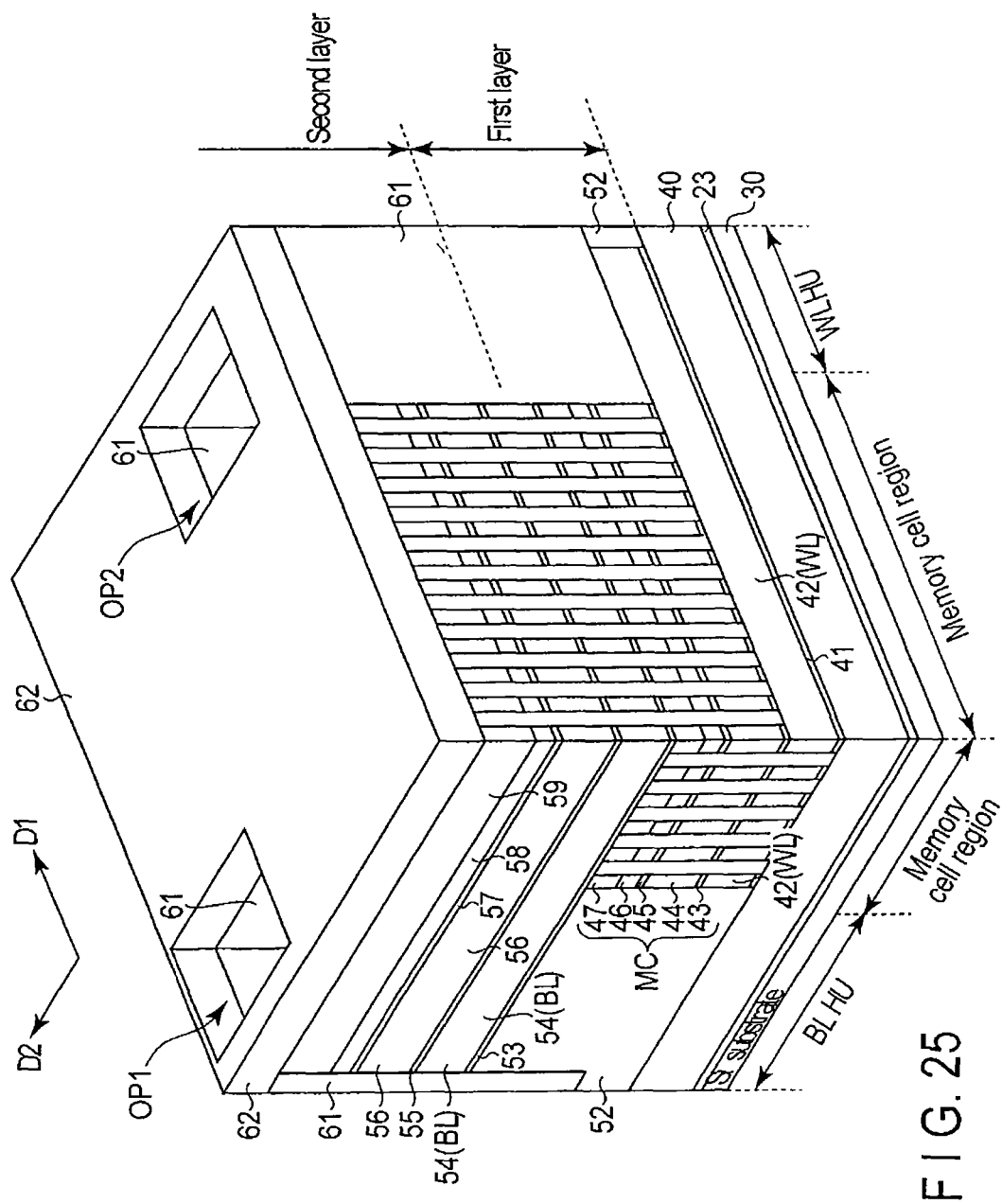
Figure 26:
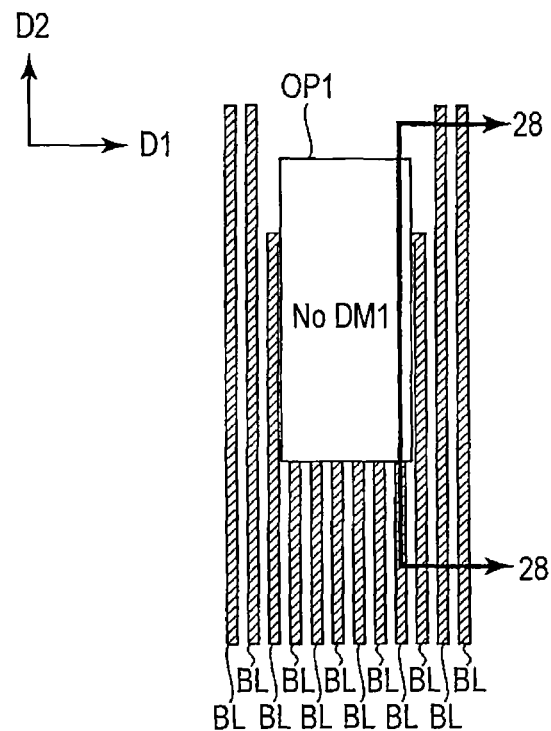
Figure 27:
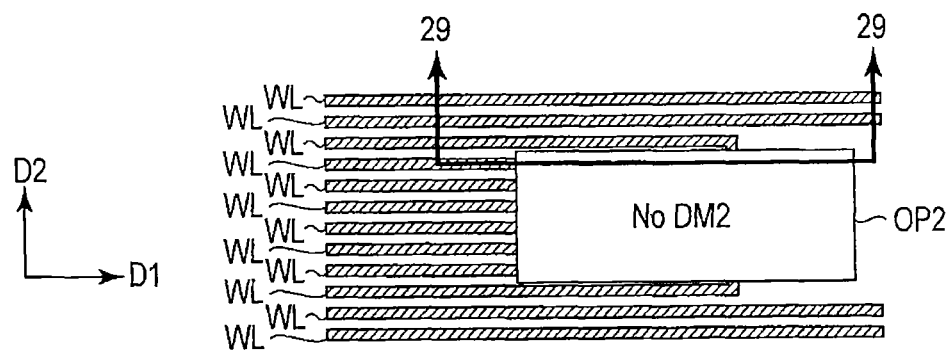
Figure 28:
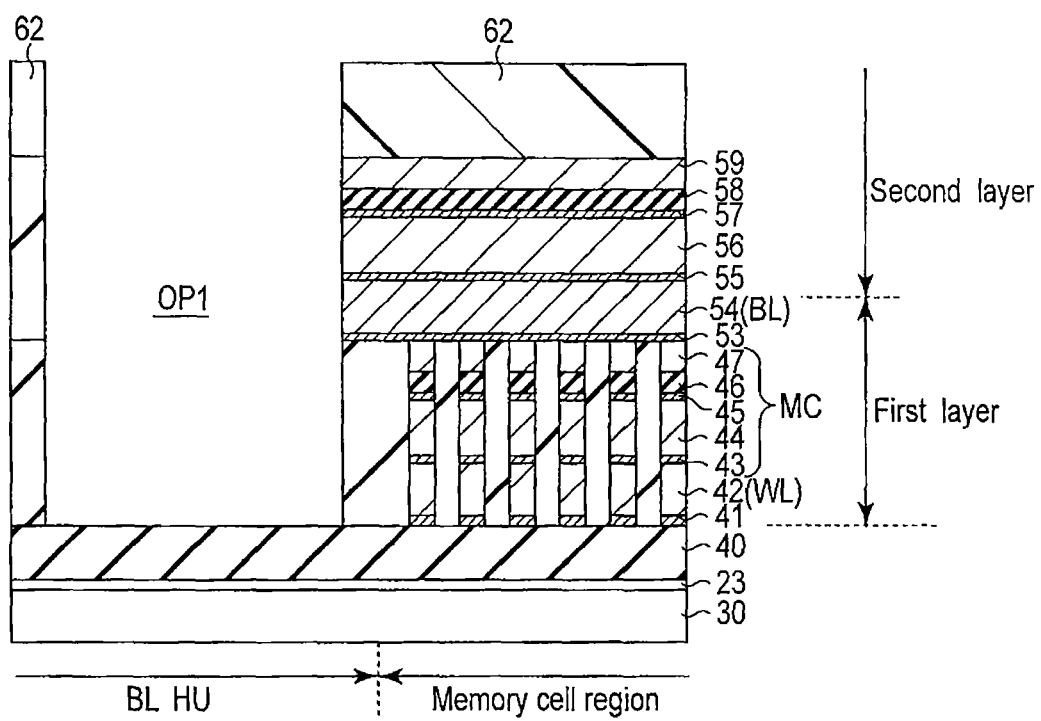

The above method of fabricating the semiconductor memory device according to the embodiment includes: forming a first interconnect layer (WL42 in FIG. 5) and a first memory cell layer (the layers 43 to 47 in FIG. 5) sequentially; patterning the first memory cell layer and the first interconnect layer to form a first structure of a linear pattern along a first direction (D1) in a first region (the memory cell region 20 in FIG. 11) and a second structure (DM1 in FIG. 11) in a second region (the BL HU 21 in FIG. 11); forming a second interconnect layer (BL54 in FIG. 13) and a second memory cell layer (the layers 55 to 59 in FIG. 13) sequentially on the first structure and the second structure; patterning the second memory cell layer and the second interconnect layer to form, in the first region, a third structure (the cell array of the second layer in FIG. 18) having a linear pattern along a second direction (D2) different from the first direction and having a folded pattern at a region immediately on the second structure in the second region; and removing the second memory cell layer and the second interconnect layer in the folded pattern of the third structure, and the first memory cell layer of the second structure positioned immediately under the folded pattern (FIGS. 25, 26 and 28).

In consequence, an area of a dummy region in a CMP step can be decreased, and fabricating steps can be simplified.

It is to be noted that the above embodiment is not the only one embodiment, and various modifications are possible. For example, in all the above-mentioned examples, the bit lines and the word lines may be replaced. Moreover, each of the bit lines and each of the word lines are not necessarily orthogonal, and directions of the lines may only be different. Further in the above embodiment, the specific examples of the materials and film thicknesses of the respective layers have been described, but another material or film thickness may suitably be used. Furthermore, the fabricating steps can be replaced as many as possible. Moreover, as each layer of memory cell array 11, there has been described the example having the structure where the diode and the variable resistance element are sequentially stacked in order from below. However, the variable resistance element may be disposed under the diode, and this order may be different for each layer. In addition, directions of the anode and the cathode of the diode can suitably be changed.

Further in the above embodiment, the ReRAM has been described as the example of the semiconductor memory device, but the embodiment is not limited to the ReRAM. That is, the embodiment can be applied to a general cross point type semiconductor memory in which each memory cell is formed at a region where an interconnect along a certain direction crosses an interconnect along another direction. Examples of such a semiconductor memory can additionally include a magnetic RAM (the MRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor memory device comprising:
   forming a first interconnect layer and a first memory cell layer sequentially;
   patterning the first memory cell layer and the first interconnect layer to form a first structure of a linear pattern along a first direction in a first region and a second structure in a second region;
   forming a second interconnect layer and a second memory cell layer sequentially on the first structure and the second structure;
   patterning the second memory cell layer and the second interconnect layer to form, in the first region, a third structure having a linear pattern along a second direction different from the first direction and having a folded pattern of the third structure at a region immediately on the second structure in the second region; and
   removing the second memory cell layer and the second interconnect layer in the folded pattern of the third structure and the first memory cell layer of the second structure positioned immediately under the folded pattern of the third structure,
   wherein the first structure has a folded pattern of the first structure at a third region different from the first and second regions, and
   when removing the second memory cell layer and the second interconnect layer in the folded pattern of the third structure and the first memory cell layer positioned immediately under the folded pattern of the third structure, the first interconnect layer and the first memory cell layer in the folded pattern of the first structure are also removed.

2. The method according to claim 1,
   wherein the removing the second memory cell layer and the second interconnect layer in the folded pattern of the third structure, and the first memory cell layer of the second structure positioned immediately under the folded pattern of the third structure includes:
   forming a mask layer on the second memory cell layer;
   making an opening in the mask layer; and
   performing etching by use of the mask layer provided with the opening as a mask,
   wherein the second structure is positioned in the opening as viewed from above.

3. The method according to claim 1,
   wherein when removing the second memory cell layer and the second interconnect layer in the folded pattern of the third structure and the first memory cell layer of the second structure positioned immediately under the folded pattern of the third structure, the first interconnect layer under the folded pattern of the third structure is also removed.

4. The method according to claim 1, further comprising:
   forming an interlayer insulating film to cover the first and second structures; and
   flattening an upper surface of the interlayer insulating film to expose an upper surface of the first structure.

5. The method according to claim 1,
   wherein the patterning the first interconnect layer and the first memory cell layer includes:
   forming a first mask layer of a linear pattern along the first direction on the first memory cell layer;
   forming a second mask layer on the first memory cell layer to cover the first mask layer;
   etching the second mask layer to expose an upper surface of the first memory cell layer while the second mask layer remains on a side surface of the first mask layer;
   removing the first mask layer after etching the second mask layer; and
   etching the first interconnect layer and the first memory cell layer by use of the second mask layer as a mask, after removing the first mask layer.

6. The method according to claim 1, further comprising:
   continuously after the patterning the second memory cell layer and the second interconnect layer, patterning the first memory cell layer, by use of the same mask as used in the patterning the second interconnect layer and the second memory cell layer.

7. The method according to claim 1,
   wherein each of the first memory cell layer and the second memory cell layer includes a diode layer and a variable resistance layer which are stacked.

8. The method according to claim 1,
   wherein the folded pattern of the first and third structure includes four or more wires and both of the most outer wirings are connected to each other so as to be folded.

9. The method according to claim 1,
   wherein the first memory cell layer is formed above the semiconductor substrate and the first direction is parallel to a main surface of the semiconductor substrate and the folded pattern folds the linear pattern along the first direction.

10. A method of fabricating a semiconductor memory device comprising:
    forming a first interconnect layer and a first memory cell layer sequentially;
    patterning the first memory cell layer and the first interconnect layer to form a first structure having a linear pattern along a first direction in a first region and having a folded pattern of the first structure in a second region;
    forming, on the first structure, a second interconnect layer and a second memory cell layer sequentially;
    patterning the second memory cell layer and the second interconnect layer to form, in the first region, a second structure of a linear pattern along a second direction different from the first direction, and form a third structure immediately on the folded pattern of the first structure in the second region; and removing the third structure, and the first memory cell layer and the first interconnect layer immediately under the third structure, wherein the second structure has a folded pattern of the second structure at a third region different from the first and second regions, and when removing the third structure, the second memory cell layer and the second interconnect layer in the folded pattern of the second structure are also removed.

11. The method according to claim 10, wherein the removing the third structure, and the first memory cell layer and the first interconnect layer immediately under the third structure includes:

forming a mask layer on the second interconnect layer and the second memory cell layer;

making an opening in the mask layer; and performing etching by use of the mask layer provided with the opening as a mask, wherein the third structure is positioned in the opening as viewed from above.

12. The method according to claim 10, further comprising:

forming an interlayer insulating film to cover the second and third structures; and flattening an upper surface of the interlayer insulating film to expose an upper surface of the second structure.

13. The method according to claim 10, wherein the patterning the first memory cell layer and the first interconnect layer includes:

forming a first mask layer of a linear pattern along the first direction on the first memory cell layer;

forming a second mask layer on the first memory cell layer to cover the first mask layer;

etching the second mask layer to expose an upper surface of the first memory cell layer while the second mask layer remains on a side surface of the first mask layer;

removing the first mask layer after etching the second mask layer; and etching the first memory cell layer and the first interconnect layer by use of the second mask layer as a mask, after removing the first mask layer.

14. The method according to claim 10, further comprising:

continuously after the patterning the second memory cell layer and the second interconnect layer, patterning the first memory cell layer, by use of the same mask as used in the patterning the second memory cell layer and the second interconnect layer.

15. The method according to claim 10, wherein each of the first memory cell layer and the second memory cell layer includes a diode layer and a variable resistance layer which are stacked.

16. The method according to claim 10, wherein the folded pattern of the first and third structure includes four or more wires and both of the most outer wirings are connected to each other so as to be folded.

17. The method according to claim 10, wherein the first memory cell layer is formed above the semiconductor substrate and the first direction and the second direction are parallel to a main surface of the semiconductor substrate and the folded pattern of the first structure in the second region folds the linear pattern along the first direction and the folded pattern of the second structure in the third region folds the linear pattern along the second direction.

* * * * *